United States Patent
Kato et al.

(10) Patent No.: US 11,047,882 B2
(45) Date of Patent: Jun. 29, 2021

(54) NON-CONTACT VOLTAGE MEASUREMENT DEVICE AND DIAGNOSIS SYSTEM

(71) Applicant: HITACHI, LTD., Tokyo (JP)

(72) Inventors: Tetsuji Kato, Tokyo (JP); Minori Nagata, Tokyo (JP); Kohji Maki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 163 days.

(21) Appl. No.: 16/349,451

(22) PCT Filed: Nov. 15, 2016

(86) PCT No.: PCT/JP2016/083806
§ 371 (c)(1),
(2) Date: May 13, 2019

(87) PCT Pub. No.: WO2018/092188
PCT Pub. Date: May 24, 2018

(65) Prior Publication Data
US 2020/0191833 A1 Jun. 18, 2020

(51) Int. Cl.
*G01R 15/16* (2006.01)
*G01R 15/06* (2006.01)
(Continued)

(52) U.S. Cl.
CPC .............. *G01R 15/16* (2013.01); *G01R 15/06* (2013.01); *G01R 19/175* (2013.01); *G01R 31/312* (2013.01)

(58) Field of Classification Search
CPC ...... G01R 15/06; G01R 15/16; G01R 19/175; G01R 31/312
See application file for complete search history.

(56) References Cited

U.S. PATENT DOCUMENTS 9,651,584 B2 * 5/2017 Gunn .................. G01R 35/005
2015/0346240 A1 * 12/2015 Gunn .................. G01R 19/0084
324/127

(Continued)

FOREIGN PATENT DOCUMENTS

JP   S63-020064 U   2/1988
JP   2001-051000 A  2/2001
(Continued)

OTHER PUBLICATIONS

English translation of JP 2005-140506 A (Year: 2005).*
(Continued)

*Primary Examiner* — Paresh Patel
(74) *Attorney, Agent, or Firm* — Foley & Lardner LLP

(57) ABSTRACT

Provided are a non-contact voltage measurement device and diagnosis system capable of acquiring the voltage of an electric wire without disconnecting the wire. The non-contact voltage measurement device (100) includes: a cylindrical fixing part (110) for holding an electric wire (10) by clipping the same from both sides; a first electrode (121) and a second electrode (122) provided on the inner peripheral surface of the electric-wire-holding side of the fixing part (110) so as to be separated by a distance (D2); a first measurement capacitor (C3) and a voltage division capacitor (C2) connected to the first electrode (121); a second measurement capacitor (C3') connected to the second electrode (122); a terminal (131) for measuring the voltage (V1) applied to the first measurement capacitor (C3); and a terminal (132) for measuring the voltage (V2) applied to the second measurement capacitor (C3').

14 Claims, 12 Drawing Sheets

(51) Int. Cl.
*G01R 19/175* (2006.01)
*G01R 31/312* (2006.01)

(56) References Cited

U.S. PATENT DOCUMENTS

| | | | |
|---|---|---|---|
| 2016/0069937 A1* | 3/2016 | Johnson | G01R 15/16 324/126 |
| 2016/0305987 A1* | 10/2016 | Sevlian | G01R 15/16 |
| 2017/0227582 A1 | 8/2017 | Iida | |

FOREIGN PATENT DOCUMENTS

| | | |
|---|---|---|
| JP | 2002-131341 A | 5/2002 |
| JP | 2004-177310 A | 6/2004 |
| JP | 2006-084380 A | 3/2006 |
| JP | 2006-153631 A | 6/2006 |
| JP | 2006-242855 A | 9/2006 |
| JP | 2015-141077 A | 8/2015 |
| JP | 5847339 B1 | 1/2016 |
| JP | 2018-550896 A | 8/2019 |
| WO | WO-2013/054782 A1 | 4/2013 |
| WO | WO-2015/178051 A1 | 11/2015 |
| WO | WO-2016/139924 A1 | 9/2016 |

OTHER PUBLICATIONS

English translation of JP 2006-242855 A (Year: 2006).*
English translation of JP 2006-153631 A (Year: 2006).*
Office Action issued in corresponding Japanese Patent Application No. 2018-550896 dated Aug. 6, 2019 with English translation.
International Search Report with English translation and Written Opinion issued in corresponding application No. PCT/JP2016/083806 dated Feb. 7, 2017.
Office Action Issued in corresponding Japanese Patent Application No. 2018-550896 dated Apr. 7, 2020, with English translation.

* cited by examiner

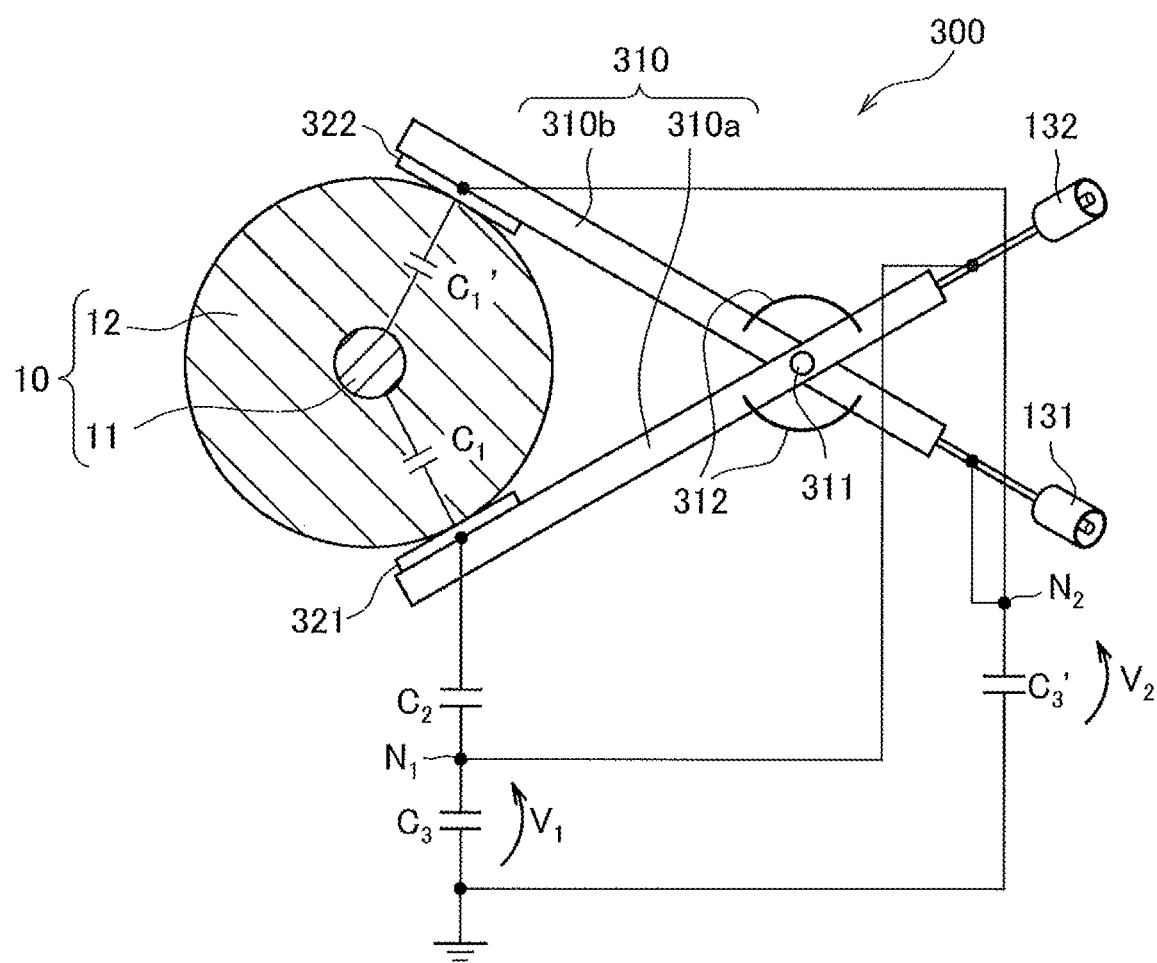

NON-CONTACT VOLTAGE MEASUREMENT DEVICE AND DIAGNOSIS SYSTEM

CROSS-REFERENCE TO RELATED APPLICATION

This application is a U.S. National Stage Application under 35 U.S.C. § 371 of International Patent Application No. PCT/JP2016/083806 filed 15 Nov. 2016, the disclosure of which is hereby incorporated by reference in their entireties.

TECHNICAL FIELD

The present invention relates to a non-contact voltage measurement device and a diagnosis system.

BACKGROUND ART

When a rotating machine such as a motor (an electric motor), a generator and so forth which is incorporated into a production facility suddenly fails, unscheduled rotating machine repairing work and replacement work become necessary and a reduction in operation rate of the production facility and review of a production plan become necessary. In order to avoid this sudden failure in advance, the motor is appropriately stopped and then a diagnosis is made in an offline state. Thereby, the degree of deterioration can be grasped and the sudden failure can be avoided to a certain extent. It is necessary to stop the rotating machine for the offline diagnosis and it induces the reduction in operation rate of the production facility. In addition, there also exists the one which becomes apparent only at the time of rotation depending on the type of deterioration. Further, there exists a need to diagnose the state of the rotating machine on the basis of information on vibration and current of the rotating machine.

It is conceivable to use voltage information of the rotating machine in combination therewith in order to increase accuracy of the diagnosis. For example, whether a change in current is caused by a change in operation state or caused by some kind of abnormality of the rotating machine is decided on the basis of the information on the voltage which is applied to the motor and thereby erroneous information and misinformation can be reduced. In order to acquire the information on the voltage, it is necessary to connect and fix a voltage probe to a metal area to which the voltage is applied. In a case of the rotating machine, in general, it is thought that a metal exposed area is a connection part between a motor lead line in a motor terminal box and a wiring cable. However, it is necessary to temporarily release connection (disconnect) between the motor lead line and the wiring cable and to fix the voltage probe together with a cable which is connected to the voltage probe with a bolt and so forth in order to electrically connect the voltage probe to the connection part between the motor lead line and the wiring cable. In particular, in a high-voltage rotating machine, there are also cases where insulation treatment is performed in such a manner that the metal area of the connection part between the motor lead line and the wiring cable is not exposed to the outside. Hurdles in newly connecting the voltage probe to a facility which is being actually driven are high for reasons of the man-hour of the insulation treatment after disconnection and the possibility of erroneous wiring of the cable due to disconnection.

In Japanese Patent Application Publication No. 2006-084380 (hereinafter, referred to as Patent Document 1), there is described a non-contact voltage measurement device which is equipped with first and second electrode which are disposed with an insulator being sandwiched therebetween, first and second reference capacitors which are connected to the first electrode and are mutually different in capacitance, a change-over switch which makes the switch between the first and second reference capacitors, a first divided voltage detection circuit which obtains divided voltages V1, V2 obtained by dividing an AC voltage which is applied to the core wire between a coupling capacitor which is formed between the first electrode and the core wire and the first or second reference capacitor, first voltage measurement means for measuring an output from this first divided voltage detection circuit and a third reference capacitor which is connected to the second electrode.

In Japanese Patent No. 5847339 (hereinafter, referred to as Patent Document 2), there is described a non-contact type AC voltage measurement device which has a first electrode which is disposed outside an electric wire and forms a first coupling capacitor which is unknown in capacitance between it and the core wire, a parallel circuit which has a first capacitor and open/close means which is connected in parallel with the first capacitor without going through a capacitor, timing signal generation means for generating a timing signal and open/close control mean which controls open/close of the open/close means in accordance with the timing signal.

SUMMARY OF THE INVENTION

Problems to be Solved

The non-contact voltage measurement device which is described in Patent Document 1 has such a problem that since switch change-over is necessary and an operation system which is adapted to electrically or mechanically operate the switch is necessary, a system for non-contact voltage measurement is formed into a complicated configuration. The non-contact type AC voltage measurement device which is described in Patent Document 2 had such a problem that since it needs the switch similarly to the device described in Patent Document 1, a system is formed into a complicated configuration. In addition, there is also such a problem that since it copes with measurement of only a constant frequency, it cannot estimate a voltage which transitionally fluctuates and a voltage waveform which fluctuates at an unexpected frequency.

The present invention has been made in view of such circumstances and aims to provide a non-contact voltage measurement device and a diagnosis system which are able to acquire a voltage of an electric wire with no need of disconnection.

Solution to Problems

In order to solve the abovementioned problems, the present invention provides a non-contact voltage measurement device used for measuring a voltage applied to a core wire of an electric wire which is coated with an insulator, without contacting the core wire, the device including: a fixing part that holds the electric wire; a first electrode and a second electrode that are provided in the fixing part separately from each other; a first measurement capacitor $C3$ and a first voltage division capacitor $C2$ that are connected to the first electrode; a second measurement capacitor $C3'$ that is connected to the second electrode; and a voltage measurement means for measuring a voltage $V1$ applied to the first measurement capacitor C3 and a voltage V2 applied to the second measurement capacitor C3'.

Advantageous Effects of the Invention

According to the present invention, there are provided the non-contact voltage measurement device and the diagnosis system which are able to acquire the voltage of the electric wire with no need of disconnection.

BRIEF DESCRIPTION OF DRAWINGS

FIGS. 5A and 5B are diagrams illustrating verification results of non-contact voltage measurement of the non-contact voltage measurement system using the non-contact voltage measurement device according to the abovementioned first embodiment, in which FIG. 5A is a waveform diagram of a voltage which is applied to a core wire of the electric wire and FIG. 5B is a waveform diagram of an output voltage of an output unit of the non-contact voltage measurement system;

FIG. 7 is a diagram illustrating a configuration of a non-contact voltage measurement device according to a third embodiment of the present invention;

FIGS. 8A and 8B are diagrams illustrating a configuration of a non-contact voltage measurement device according to a fourth embodiment of the present invention, in which FIG. 8A is a perspective view illustrating the whole configuration and FIG. 8B is an essential part perspective view;

DETAILED DESCRIPTION

First Embodiment

Figure 1:
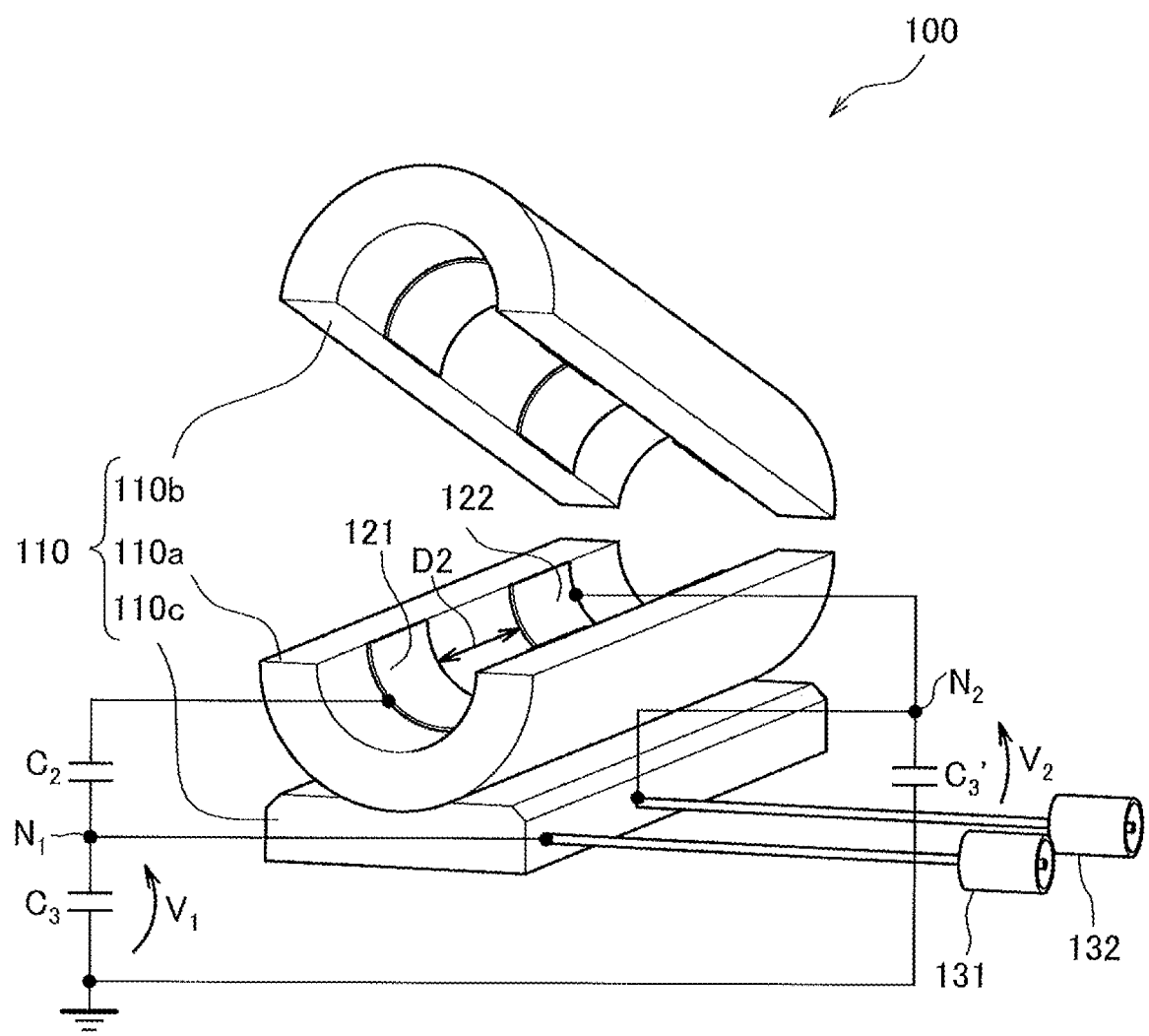
FIG. 1 is a diagram illustrating a configuration of a non-contact voltage measurement device according to a first embodiment of the present invention.
Figure 2:
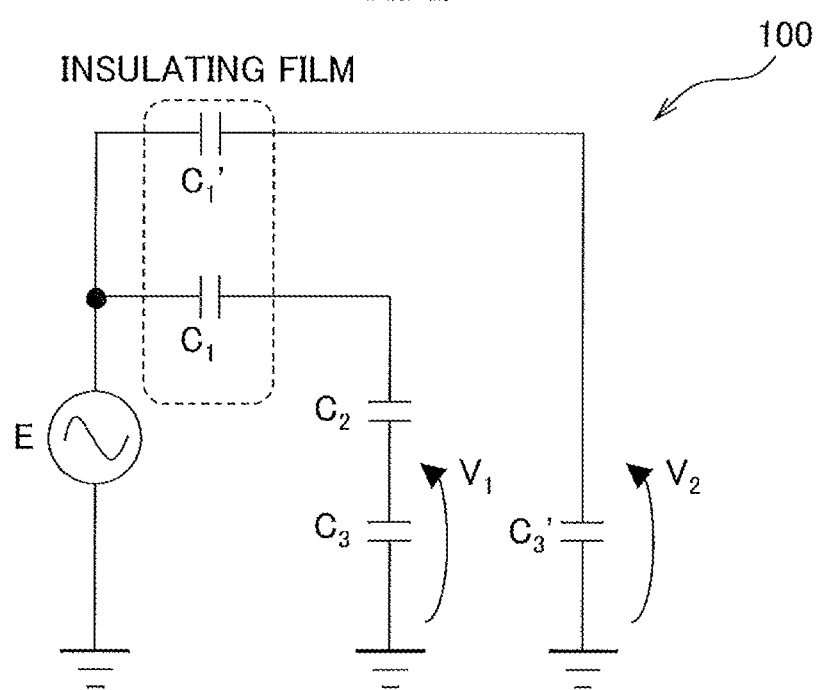
FIG. 2 is an equivalent circuit diagram of the non-contact voltage measurement device according to the abovementioned first embodiment.
Figure 3:
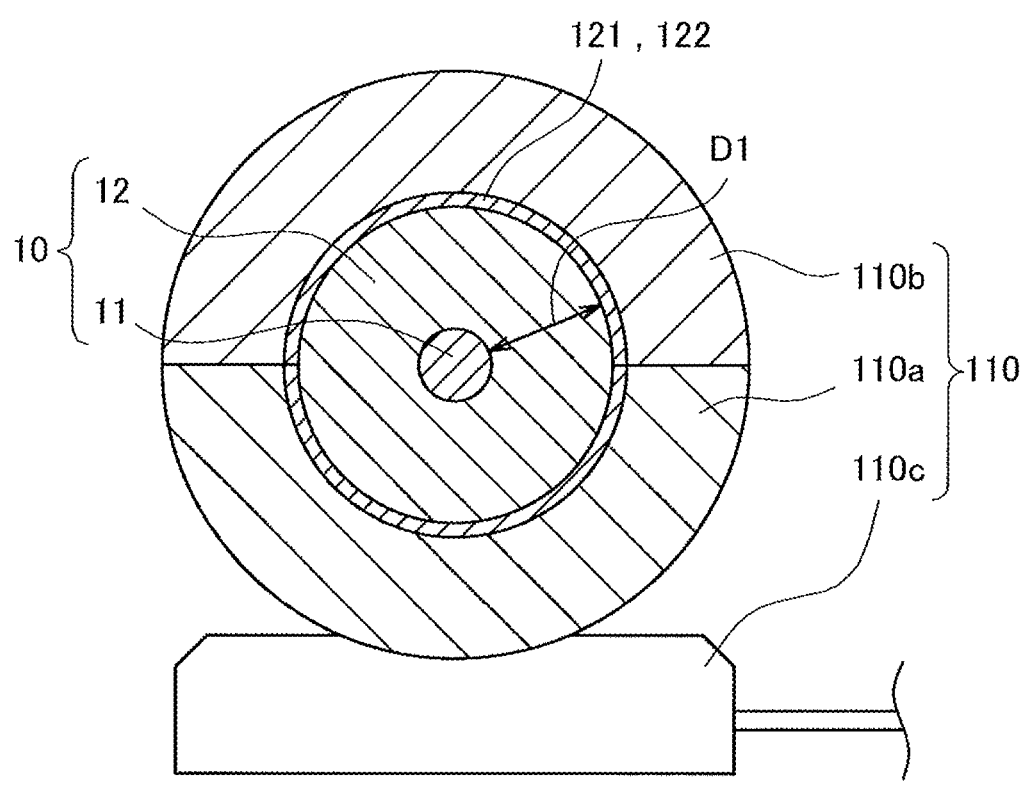
FIG. 3 is a sectional diagram of an electric wire which is held by a fixing part of the non-contact voltage measurement device according to the abovementioned first embodiment.

In the following, embodiments of the present invention will be described in detail with reference to the drawings. FIG. 1 is a diagram illustrating a configuration of a non-contact voltage measurement device according to the first embodiment of the present invention. FIG. 2 is an equivalent circuit diagram of the non-contact voltage measurement device in FIG. 1. FIG. 3 a sectional diagram of an electric wire which is held by a fixing part of the non-contact voltage measurement device in FIG. 1. As illustrated in FIG. 1 and FIG. 2, a non-contact voltage measurement device 100 is equipped with a cylindrical fixing part 110 which holds an electric wire 10 (see FIG. 3) by sandwiching it from the both sides, a first electrode 121 and a second electrode 122 which are disposed on an electric wire holding side inner peripheral surface of the fixing part 110 separately from each other by a distance D2, a first measurement capacitor C3 and a voltage division capacitor C2 (a first voltage division capacitor) which are connected to the first electrode 121, a second measurement capacitor C3' which is connected to the second electrode 122, a terminal 131 (voltage measurement means) which is adapted to measure a voltage V1 which is applied to the first measurement capacitor C3 and a terminal 132 (voltage measurement means) which is adapted to measure a voltage V2 which is applied to the second measurement capacitor C3'.

As illustrated in FIG. 3, the electric wire 10 is a cable that an outer peripheral portion of a core wire (including a case of a strand wire) 11 which is made of a copper material and so forth is coated with an insulator 12. A radial distance from the outer peripheral portion of the core wire 11 to the first electrode 121 or the second electrode 122 is denoted by D1. Although most of the distance D1 is occupied by an insulating film of the insulator 12, air layers slightly exist in an interface between the core wire (in the case of the strand wire, there are many air gaps) 11 and the insulating film and an interface between the insulating film and the first electrode 121 or the second electrode 122. As illustrated in FIG. 2, a capacitance of the insulating film between the core wire 11 of the electric wire 10 and the first electrode 121 is denoted by C1 and a capacitance of the insulating film between the core wire 11 of the electric wire 10 and the second electrode 122 is denoted by C1'. The capacitances C1, C1' and an AC voltage E (in the following, referred to as the voltage E) of the core wire 11 are unknown values. The first measurement capacitor C3, the voltage division capacitor C2, the second measurement capacitor C3', the voltage V1 and the voltage V2 are known values or measurable values. The non-contact voltage measurement device 100 measures the voltage E which is applied to the core wire 11 which is coated with the insulator 12 out of contact with the core wire 11 on the basis of the first measurement capacitor C3, the voltage division capacitor C2, the second measurement capacitor C3', the voltage V1 and the voltage V2.

<Fixing Part>

Figure 10:
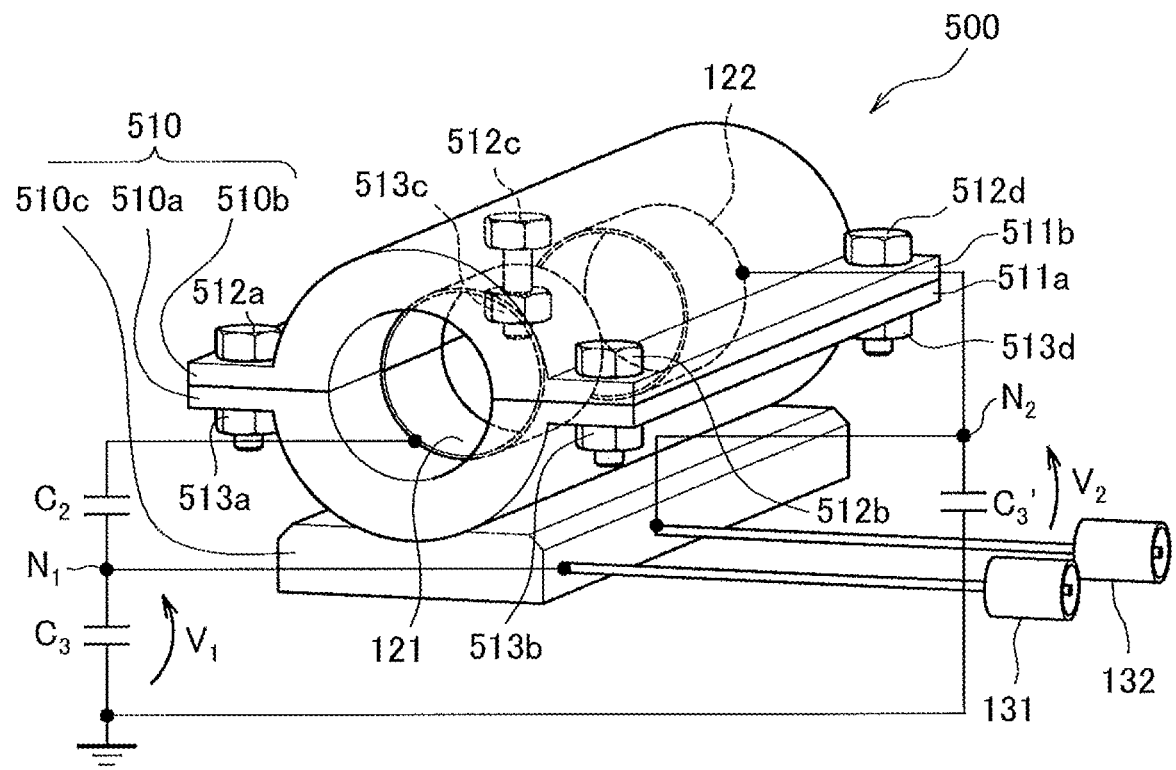
FIG. 10 is a diagram illustrating a configuration of a non-contact voltage measurement device according to a fifth embodiment of the present invention.

As illustrated in FIG. 1, the fixing part 110 is equipped with a lower-side fixing section 110a which supports the electric wire 10 (see FIG. 3) from the lower side and is semi-annular in a cross sectional view, an upper-side fixing section 110b which presses the electric wire 10 from the upper side by being combined with the lower-side fixing section 110a and is semi-annular in the cross sectional view and a pedestal 110c which fixes the bottom of the lower-side fixing section 110a and from which the terminals 131, 132 are drawn out. In addition, although illustration is omitted, it is equipped with fixing means for fixing the lower-side fixing section 110a and the upper-side fixing section 110b by mutually superimposing them concentrically. This fixing means is, for example, hinge portions (illustration is omitted) which are provided on one ends of the lower-side fixing section 110a and the upper-side fixing section 110b and hook portions (illustration is omitted) which are provided on the other ends thereof. In addition, this fixing means is bolt/nut which fasten together flange portions of the lower-side fixing section 510a and the upper-side fixing section 510b which are illustrated in FIG. 10 which will be described later.

The fixing part 110 holds the electric wire 10 (see FIG. 3) by concentrically superimposing the lower-side fixing section 110a and the upper-side fixing section 110b into a cylindrical section and presses the electric wire 10 in a radial direction by the fixing means (illustration is omitted). The fixing part 110 is configured in such a manner that the first electrode 121 and the second electrode 122 sandwich and hold the electric wire 10 with mutually equal pressing forces.

An installation position of the fixing part 110 will be described. Although there is no particular limitation to the position where the fixing part 110 is to be installed, it is desirable to install it at a position where it does not move with the vibration and so forth of the motor and a position where it is easy to connect it with the ground (GND). It can be selected from the inside of the motor terminal pedestal, a motor housing, the inside of an inverter box or a cable drawing around part on the basis of the abovementioned viewpoints. In addition, it may be fixed to a position where vibration-induced movement is difficult such as, for example, the inside of the inverter box or a cable rack (a ladder-like tool which is suspended from a ceiling and through which wiring passes) of the cable drawing around part by taking secular change into consideration.

The fixing part 110 adopts a configuration that the first measurement capacitor C3, the voltage division capacitor C2 and/or the second measurement capacitor C3' are housed therein. Alternatively, the fixing part 110 is equipped with a terminal which is adapted to connect the first measurement capacitor C3, the voltage division capacitor C2 and/or the second measurement capacitor C3' to the first electrode 121 and the second electrode 122 which are provided in the fixing part 110 and to the terminals 131, 132. That is, the non-contact voltage measurement device 100 may have either the structure that each capacitor is housed in the fixing part 110 or a configuration that each capacitor is externally attached to the outside of the fixing part 110. The former configuration has such advantages that handling thereof is easy and it is higher in safety because the capacitors are not exposed to the outside. The latter configuration has such advantages that cost reduction can be promoted because the capacitors are not built in it and selection of the capacitor is easy.

<First Electrode and Second Electrode>

As illustrated in FIG. 1, the first electrode 121 and the second electrode 122 are metal plates or metal foil which are formed on inner peripheral portions of the fixing part 110 in curved states. The first electrode 121 and the second electrode 122 are electrically insulated from each other. The first electrode 121 and the second electrode 122 are respectively formed on inner peripheral portions of the lower-side fixing section 110a and the upper-side fixing section 110a because of adoption of a configuration that the fixing part 110 is divided into two sections of the lower-side fixing section 110a and the upper-side fixing section 110b. However, in a case where the lower-side fixing section 110a and the upper-side fixing section 110b are mutually combined into one (when pressing the electric wire), they are electrically connected with each other and form a ring-shaped electrode. Areas S of inner peripheral surfaces of the first electrode 121 and the second electrode 122 are made to be equal to each other. In addition, the first electrode 121 and the second electrode 122 are pressed against the electric wire 10 (see FIG. 3) with almost the same pressing forces by the fixing part 100.

The first electrode 121 is provided on one end side of the cylindrical fixing part 110 and the second electrode 122 is provided on the other end side separately from the first electrode 121 by the predetermined distance D2. It is desirable that the first electrode 121 and the second electrode 122 be installed as close as possible while being separated from each other by the distance D2. The pressing forces on the electric wire 10 by the fixing part 110 can be made equal to each other and influences of environmental changes such as humidity, vibration and so forth that the first electrode 121 and the second electrode 122 receive from the outside of the fixing part 110 can be made uniform by installing the first electrode 121 and the second electrode 122 so as to be close to each other. Here, the radial distance D1 from the core wire 11 of the electric wire (see FIG. 3) to the first electrode 121 or the second electrode 122 and the distance D2 between the first electrode 121 and the second electrode 122 are D2>D1.

In addition, in a case where the electric wire 10 is the strand wire, there are more gaps in the outer peripheral surface of the core wire 11 than in a case where it is a single wire. In the non-contact voltage measurement device 100 which is used for application of measuring the voltage of the electric wire 10 which is the strand wire like this, it is desirable to more increase the areas S of the inner peripheral surfaces of the first electrode 121 and the second electrode 122 which are installed in the fixing part 110. In the configuration in FIG. 1, the first electrode 121 and the second electrode 122 are made long in a longitudinal direction.

As illustrated in FIG. 1, the first electrode 121 is connected to GND via the voltage division capacitor C2 and the first measurement capacitor C3 which are connected in series with each other. A connection point N1 between the voltage division capacitor C2 and the first measurement capacitor C3 is connected to the terminal 131 which is adapted to measure the voltage V1. In addition, the second electrode 122 is connected to GND via the second measurement capacitor C3'. A connection point N2 between the second electrode 122 and the second measurement capacitor C3' is connected to the terminal 132 which is adapted to measure the voltage V2.

In the following, a voltage measuring method of the non-contact voltage measurement device 100 which is configured as mentioned above will be described. The non-contact voltage measurement device 100 is the one which measures the voltage E which is applied to the core wire 11 out of contact with the core wire 11 in a case where the voltage E is applied to the core wire 11 of the electric wire 10. As illustrated in FIG. 1, the non-contact voltage measurement device 100 is equipped with the fixing part 110 which covers the electric wire 10 (the cable) (see FIG. 3) and the two first electrode 121 and second electrode 122 which are the same as each other in area S are formed in the fixing part 110. The radial distance from the core wire 11 of the electric wire 10 to the first electrode 121 or the second electrode 122 is denoted by D1 and the distance between the first electrode 121 and the second electrode 122 is denoted by D2. In addition, the well-known first measurement capacitor C3 and voltage division capacitor C2 are connected to the first electrode 121 and the well-known second measurement capacitor C3' is connected to the second electrode 122. The voltage V1 which is applied to the first measurement capacitor C3 via the terminal 131 can be measured and the voltage V2 which is applied to the second measurement capacitor C3' via the terminal 132 can be measured.

As illustrated in FIG. 1, the two first electrode 121 and second electrode 122 which are the same as each other in area S are formed in the fixing part 110 of the non-contact voltage measurement device 100 and the two first electrode 121 and second electrode 122 are pressed against the electric wire 10 (see FIG. 3) with almost the same pressing forces by the fixing part 110. It is necessary that the first electrode 121 and the second electrode 122 be electrically insulated from each other. The voltages V1, V2 which are divided between the capacitances (C1, C1') of the insulating coating of the electric wire 10 and between the capacitances (C2, C3) of the voltage division capacitor C2 and the first measurement capacitor C3 are measured at two places on the electric wire 10. The capacitances (C1, C1') of the insulating coating of the electric wire 10 are the unknown values and the capacitances (C2, C3) of the voltage division capacitor C2 and the first measurement capacitor C3 and the voltages (V1, V2) which are measured at the two places on the electric wire 10 are the known values. In the present embodiment, the two first electrode 121 and second electrode 122 which are the same as each other in area S are formed in the fixing part 110 and the two first electrode 121 and second electrode 122 are pressed against the electric wire 10 with almost the same pressing forces. From this, a relation of C1≈C1' is established between the capacitances (C1, C1') of the insulating coating (see the part which is surrounded by the broken line in FIG. 2) of the electric wire 10. In the following, a capacitance C of the electric wire 10 will be described. The capacitance C of the electric wire 10 is expressed by Formula (1).

$$C = 2\pi\varepsilon_o\varepsilon_r L (\log((a+b)/a))^{-1} \quad (1),$$

where $\varepsilon_o$: dielectric constant of vacuum;
$\varepsilon_r$: relative dielectric constant of the insulating film;
L: length of the electrode;
a: radius of the core wire of the electric wire; and
b: distance from the outer peripheral portion of the core wire of the electric wire to the electrode.

As described above, most of the insulator 12 ranging from the outer peripheral portion of the core wire 11 of the electric wire 10 which is illustrated in FIG. 3 to the first electrode 121 or the second electrode 122 is occupied by the insulating film. In addition, the air layers slightly exists in part of the interface between the core wire 11 and the insulating film and the interface between the insulating film and the first electrode 121 or the second electrode 122 and the relative dielectric constant of synthesis ranging from the outer peripheral portion of the core wire 11 of the electric wire 10 to the first electrode 121 or the second electrode 122 is denoted by $\varepsilon_r$. In addition, the radius a in the abovementioned formula (1) is the radial distance from the center of the core wire 11 which is illustrated in FIG. 3 to the outer peripheral portion of the core wire 11. The distance b is the radial distance D1 from the outer peripheral portion of the core wire 11 which is illustrated in FIG. 3 to the first electrode 121 or the second electrode 122. The length L in the abovementioned formula (1) is the distance of the first electrode 121 (or the second electrode 122) in the fixing part 110 in an axis direction of the core wire 11. The area S of the inner peripheral surface of the first electrode 121 is expressed by $2\pi L(a+b)$ and is the area which is equal to that of the second electrode 122. Here, the fixing part 110 presses the electric wire 10 by sandwiching it from the both sides and thereby the insulating film of the insulator 12 is compressed and the distance b in the abovementioned formula (1) becomes small.

The first measurement capacitor C3, the voltage division capacitor C2, the second measurement capacitor C3', the voltage V1 and the voltage V2 are the known values. In addition, values of the voltages (V1, V2) are measured at the two places. The capacitance C1 of the insulating film (see the part which is surrounded by the broken line in FIG. 2) between the core wire 11 of the electric wire 10 and the first electrode 121, the capacitance C1' of the insulating film between the core wire 11 of the electric wire 10 and the second electrode 122 and the voltage E are the unknown values. The two first electrode 121 and second electrode 122 which are the same as each other in area S are formed in the fixing part 110 and the two first electrode 121 and second electrode 122 are pressed against the electric wire 10 with almost the same pressing forces. From this, the relation of C1≈C1' is established between the capacitances (C1, C1') of the insulating coating of the electric wire 10. When approximating it as C1=C1' by ignoring a difference between the capacitances, the following relational Formulas (2) to (4) are established.

$$E = V_2 C_3' \left( \frac{1}{C_1'} + \frac{1}{C_3'} \right) \quad (2)$$

$$E = V_1 C_3 \left( \frac{1}{C_1} + \frac{1}{C_2} + \frac{1}{C_3} \right) \quad (3)$$

$$C_1' = C_1 \quad (4)$$

The voltage E of the core wire 11 is expressed by Formula (5) from the abovementioned Formulas (2) to (4).

$$E = \frac{C_3}{C_2} \cdot \frac{V_1 V_2}{V_1 - V_2} \quad (5)$$

However, in the abovementioned formula (5), V1−V2=0 is forbidden. In a case where V1−V2=0, only E=0 is established.

Here, even if the capacitances (C1, C1') of the insulating coating of the electric wire 10 change due to moisture absorption and so forth, C1 and C1' will deteriorate in a similar way because the first electrode 121 and the second electrode 122 are formed at mutually close positions. Therefore, influences on voltage measurement in association with environmental changes and aging changes can be suppressed. In addition, if the voltage E of the core wire 11 is already known, a difference between C1 and C1' may be corrected by using the known voltage E as a voltage for correction. In this case, a method of putting a capacitance of C1–C1' into C2 is conceivable. Alternatively, a method of adjusting the pressing forces on the electric wire 10 in such a manner that C1=C1' is conceivable.

Figure 4:
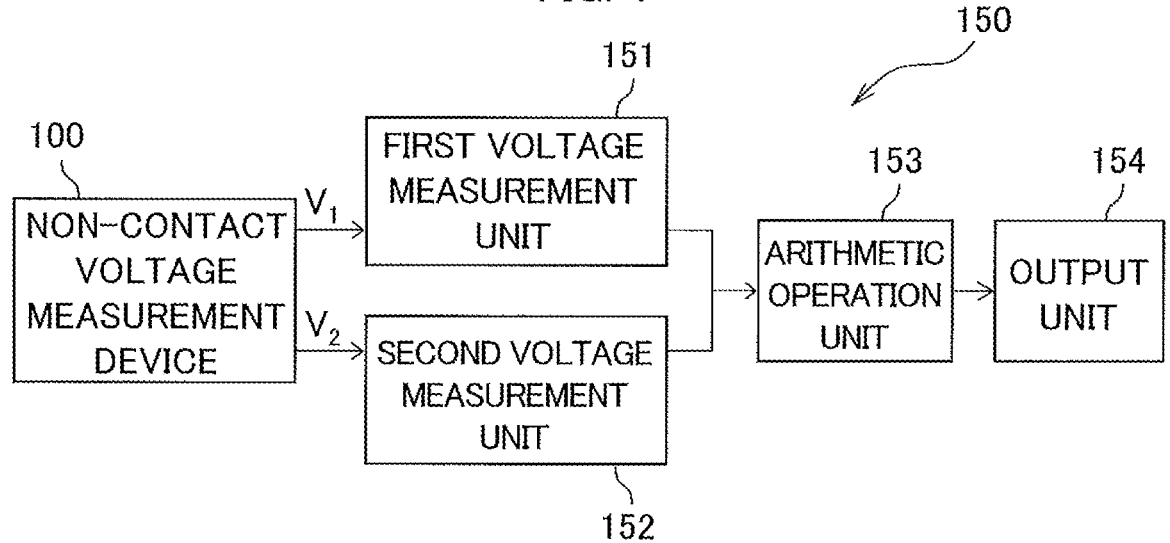
FIG. 4 is a block diagram illustrating a configuration of a non-contact voltage measurement system using the non-contact voltage measurement device according to the abovementioned first embodiment.

FIG. 4 is a block diagram illustrating a configuration of a non-contact voltage measurement system 150 using the non-contact voltage measurement device 100. The non-contact voltage measurement system 150 outputs a voltage value (the voltage E of the core wire 11) out of contact therewith by using the non-contact voltage measurement device 100. As illustrated in FIG. 4, the non-contact voltage measurement system 150 is equipped with a first voltage measurement unit 151 (voltage measurement means) which measures the voltage V1 which is applied to the first measurement capacitor C3, a second voltage measurement unit 152 (voltage measurement means) which measures the voltage V2 which is applied to the second measurement capacitor C3', an arithmetic operation unit 153 (arithmetic operation means) which arithmetically operates the voltage E of the core wire 11 in accordance with the formula (5) on the basis of the measured voltages (V1, V2) and the capacitances (C2, C3) of the voltage division capacitor C2 and the first measurement capacitor C3 and an output unit 154 which outputs the arithmetically operated voltage E. Incidentally, the first voltage measurement unit 151 is connected to the terminal 131 which is illustrated in FIG. 1 and the second measurement unit 152 is connected to the terminal 132 which is illustrated in FIG. 1.

The first voltage measurement unit 151 and the second voltage measurement unit 152 are configured by voltage sensors. The first voltage measurement unit 151 and the second voltage measurement unit 152 measure the values of the voltages (V1, V2) at the two places on the electric wire 10 (see FIG. 3) and input them into the arithmetic operation unit 153. The arithmetic operation unit 153 is configured by a microcomputer and so forth. The arithmetic operation unit 153 stores therein the values of the capacitances (C2, C3) of the voltage division capacitor C2 and the first measurement capacitor C3 which are illustrated in FIG. 1. The arithmetic operation unit 153 performs estimated arithmetic operation on the voltage E of the core wire 11 in accordance with the abovementioned formula (5) on the basis of the measured voltages (V1, V2) and the capacitances (C2, C3) of the voltage division capacitor C2 and the first measurement capacitor C3. The output unit 154 outputs the value of the voltage E which is obtained by the estimated arithmetic operation as analog or digital data. The output unit 154 is, for example, a display unit such as a monitor and so forth, a print unit such as a printer and so forth and a communication unit which transmits the data.

Figure 5A:
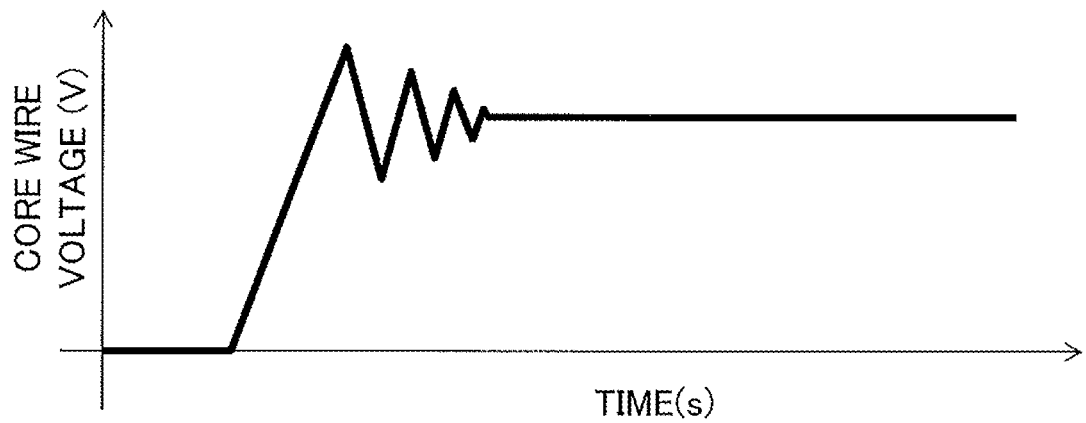
Figure 5B:
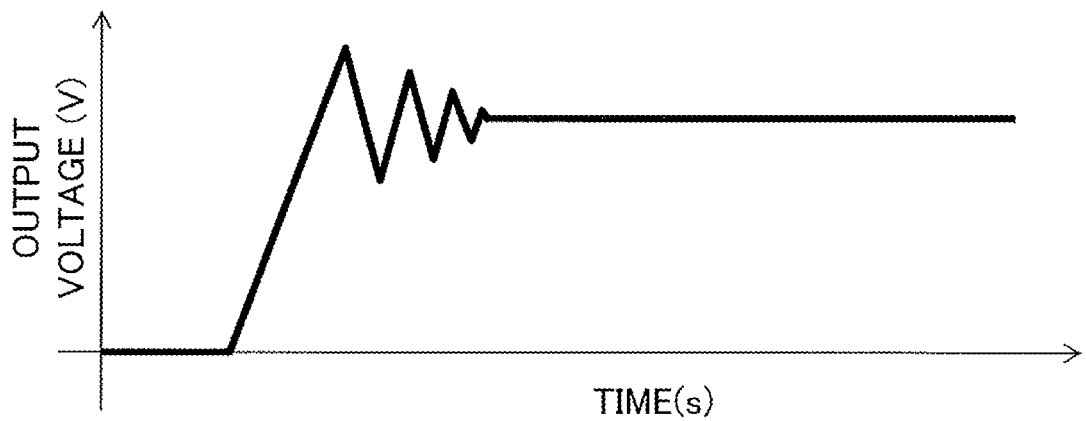

FIG. 5 is diagrams illustrating a verification result of non-contact voltage measurement of the non-contact voltage measurement system 150, in which FIG. 5A is a waveform diagram of a voltage which is applied to the core wire 11 and FIG. 5B is a waveform diagram of an output voltage of the output unit 154. Non-contact voltage measurement of the non-contact voltage measurement system 150 was verified by applying the known voltage to the core wire 11 of the electric wire 10 (see FIG. 3) and comparing it with the voltage of the output unit 154. As illustrated in FIG. 5, the voltage (see FIG. 5A) applied to the core wire 11 of the electric wire 10 perfectly matched the output voltage (see FIG. 5B) and thereby the effect of the present embodiment could be verified.

As described above, the non-contact voltage measurement device 100 of the present embodiment is equipped with the cylindrical fixing part 110 which holds the electric wire 10 by sandwiching it from the both sides, the first electrode 121 and the second electrode 122 which are provided on the inner peripheral surface on the electric wire holding side of the fixing part 110 separately from each other by the distance D2, the first measurement capacitor C3 and the voltage division capacitor C2 which are connected to the first electrode 121, the second measurement capacitor C3' which is connected to the second electrode 122, the terminal 131 which is adapted to measure the voltage V1 which is applied to the first measurement capacitor C3 and the terminal 132 which is adapted to measure the voltage V2 which is applied to the second measurement capacitor C3'. In addition, the non-contact voltage measurement system 150 uses the non-contact voltage measurement device 100 and arithmetically operates the voltage E which is applied to the core wire 11 of the electric wire 10 by using $E=(C3/C2)\times(V1V2)/(V1-V2)$ of the formula (5).

Owing to this configuration, the voltage E which is applied to the core wire 11 of the electric wire 10 which is coated with the insulator 12 can be measured out of contact with the core wire 11. As a result, voltage information of equipment such as a rotating machine and so forth can be acquired with no need of disconnection.

In addition, the non-contact voltage measurement device 100 of the present embodiment does not need such switch and switch changeover control as those in the devices described in Patent Documents 1 and 2 and is able to acquire the voltage information by the simple configuration. Moreover, the non-contact voltage measurement device 100 of the present embodiment is able to measure the voltages (V1, V2) at all times and therefore is able to measure a voltage which transiently fluctuates and a voltage waveform which fluctuates at an unexpected frequency.

Second Embodiment

Figure 6:
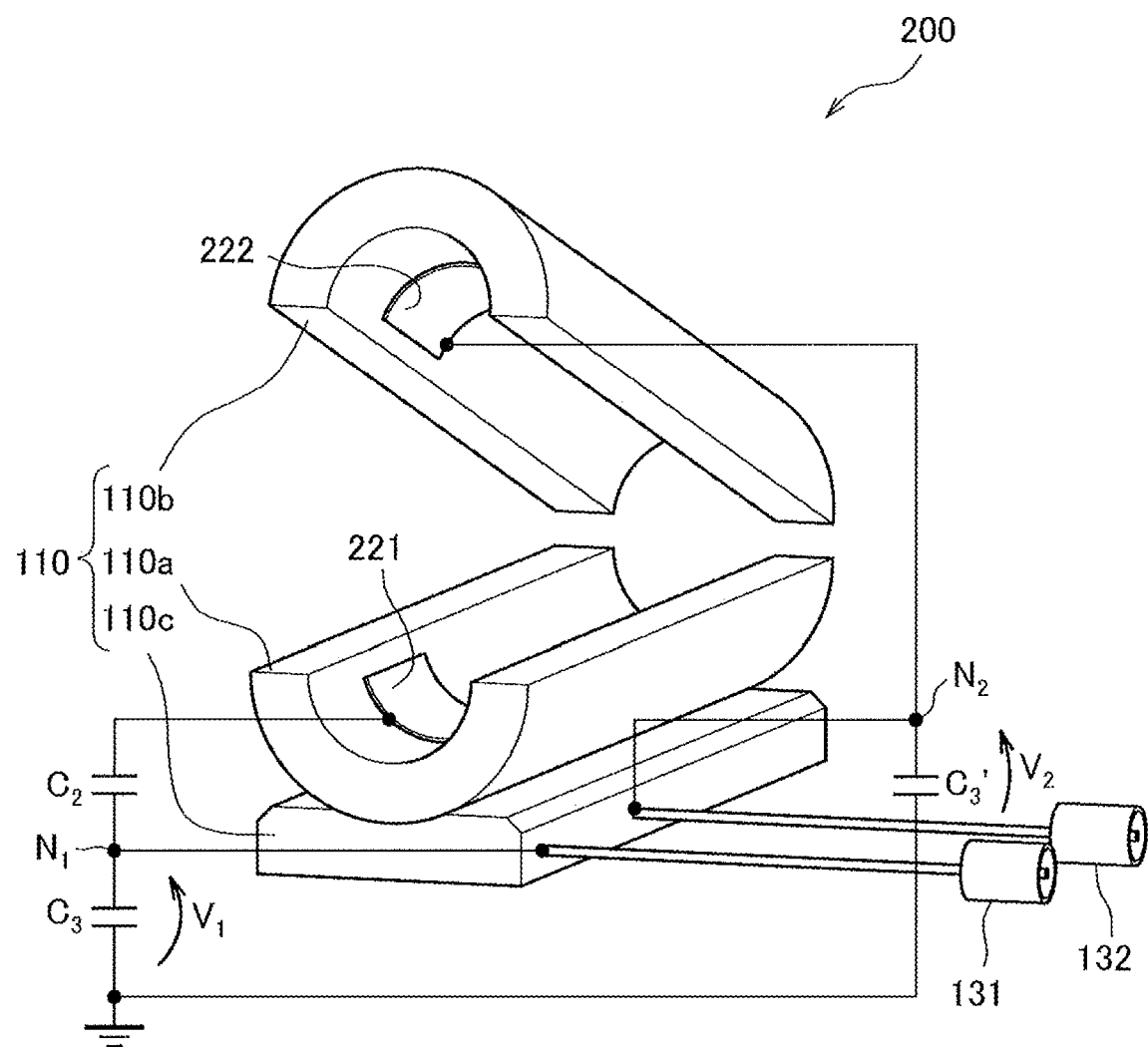
FIG. 6 is a diagram illustrating a configuration of a non-contact voltage measurement device according to a second embodiment of the present invention.

FIG. 6 is a diagram illustrating a configuration of a non-contact voltage measurement device according to the second embodiment of the present invention. The same numerals are assigned to constituting parts which are the same as those in FIG. 1 and description of duplicated parts is omitted. As illustrated in FIG. 6, a non-contact voltage measurement device 200 is equipped with the cylindrical fixing part 110 which holds the electric wire 10 (see FIG. 3) by sandwiching it from the both sides, a first electrode 221 and a second electrode 222 which are provided on the electric wire holding side inner peripheral surface of the fixing part 110 so as to face each other, the first measurement capacitor C3 and the voltage division capacitor C2 which are connected to the first electrode 221, the second measurement capacitor C3' which is connected to the second electrode 222, the terminal 131 which is adapted to measure the voltage V1 which is applied to the first measurement capacitor C3 and the terminal 132 which is adapted to measure the voltage V2 which is applied to the second measurement capacitor C3'. As described above, the capacitance C1 of the insulating film between the core wire 11 of the electric wire 10 and the first electrode 221, the capacitance C1' of the insulating film between the core wire 11 of the electric wire 10 and the second electrode 222 and the voltage E of the core wire 11 are the unknown values. The first measurement capacitor C3, the voltage division capacitor C2, the second measurement capacitor C3', the voltage V1 and the voltage V2 are the known values or the measurable values.

<First Electrode and Second Electrode>

As illustrated in FIG. 6, the first electrode 221 and the second electrode 222 are metal plates or metal foil which are formed on the inner peripheral portions of the fixing part 110 in the curved states. The first electrode 221 and the second electrode 222 are electrically insulated from each other. The first electrode 221 is formed at the center of a semi-circular inner peripheral portion of the lower-side fixing section 110a of the fixing part 110. The second electrode 222 is formed at the center of a semi-circular inner peripheral portion of the upper-side fixing section 110b of the fixing part 110. In a case where the lower-side fixing section 110a and the upper-side fixing section 110b are mutually combined into one (when pressing the electric wire), the first electrode 221 and the second electrode 222 face each other with the electric wire 10 (see FIG. 3) being sandwiched therebetween. The areas S of inner peripheral surfaces of the first electrode 221 and the second electrode 222 are made equal to each other. In addition, the first electrode 221 and the second electrode 222 are pressed against the electric wire 10 (see FIG. 3) with almost the same pressing forces by the fixing part 110.

The pressing forces on the electric wire by the fixing part 110 can be made equal to each other and the influences of environmental changes such as the humidity, the vibration and so forth that the first electrode 221 and the second electrode 222 receive from the outside of the fixing part 110 can be made uniform by installing the first electrode 221 an the second electrode 222 on the inner peripheral surface of the fixing part 110 so as to face each other.

As illustrated in FIG. 6, the first electrode 221 is connected to GND via the voltage division capacitor C2 and the first measurement capacitor C3 which are connected in series with each other. The connection point N1 between the voltage division capacitor C2 and the first measurement capacitor C3 is connected to the terminal 131 which is adapted to measure the voltage V1. In addition, the second electrode 222 is connected to GND (grounded) via the second measurement capacitor C3'. The connection point N2 between the second electrode 222 and the second measurement capacitor C3' is connected to the terminal 132 which is adapted to measure the voltage V2.

In the following, a voltage measuring method of the non-contact voltage measurement device 200 which is configured as mentioned above will be described. As illustrated in FIG. 6, the two first electrode 221 and second electrode 222 which are the same as each other in area S are installed on the electric wire holding side of the fixing part 110 of the non-contact voltage measurement device 200 so as to face each other and the two first electrode 221 and second electrode 222 are pressed against the electric wire 10 (the cable) (see FIG. 3) with the same pressing forces by the fixing part 110. Since the fixing part 110 holds the first electrode 221 and the second electrode 222 from the both sides, the pressing forces of the first electrode 221 and the second electrode 222 become the same as each other. The voltages V1, V2 which are divided between the capacitances (C1, C1') of the insulating coating of the electric wire 10 and between the capacitances (C2, C3) of the voltage division capacitor C2 and the first measurement capacitor C3 are measured at two places on the electric wire 10. In the present embodiment, the two first electrode 221 and second electrode 222 which are the same as each other in area S are formed in the fixing part 110 and the two first electrode 221 and second electrode 222 are pressed against the electric wire 10 with the same pressing forces. From this, the aforementioned formula (5) is established.

Here, even if the capacitances (C1, C1') of the insulating coating of the electric wire 10 change due to the moisture absorption and so forth, C1 and C1' will deteriorate in a similar way because the first electrode 121 and the second electrode 122 are formed at mutually facing positions. Therefore, the influences on voltage measurement in association with the environmental changes and the aging changes can be suppressed. In addition, if the voltage E of the core wire 11 is already known similarly to that in the first embodiment, the difference between C1 and C1' may be corrected by using the known voltage E as the voltage for correction. In this case, the method of putting the capacitance of C1–C1' into C2 is conceivable. Alternatively, the method of adjusting the pressing forces on the electric wire 10 in such a manner that C1=C1' is conceivable. The non-contact voltage measurement device 200 of the present embodiment can be applied to the non-contact voltage measurement system 150 illustrated in FIG. 4 and the same effect as the above can be obtained. In addition, since the fixing part 110 holds the first electrode 221 and the second electrode 222 from the both sides in the present embodiment, the pressing forces of the first electrode 221 and the second electrode 222 become the same as each other. Therefore, adjustment for equalizing the pressing forces becomes unnecessary and the device can be more simplified. However, such calibration of the capacitances (C1, C1') performed by adjustment of the pressing forces as that in a fifth embodiment which will be described later is restricted. In addition, in the present embodiment, a longitudinal-direction dimension of the fixing part 110 can be made short and the device can be more miniaturized.

Third Embodiment

FIG. 7 is a diagram illustrating a configuration of a non-contact voltage measurement device according to the third embodiment of the present invention. The same numerals are assigned to the constituting parts which are the same as those in FIG. 1 and description of duplicated parts is omitted. As illustrated in FIG. 7, a non-contact voltage measurement device 300 is equipped with a fixing part 310 which grips and holds the electric wire 10, a first electrode 321 and a second electrode 322 which are provided on the electric wire holding side of the fixing part 310, the first measurement capacitor C3 and the voltage division capacitor C2 which are connected to the first electrode 321, the second measurement capacitor C3' which is connected to the second electrode 322, a terminal 331 which is adapted to measure the voltage V1 which is applied to the first measurement capacitor C3 and a terminal 332 which is adapted to measure the voltage V2 which is applied to the second measurement capacitor C3'. The capacitance C1 of the insulating film between the core wire 11 of the electric wire 10 and the first electrode 321, the capacitance C1' of the insulating film between the core wire 11 of the electric wire 10 and the second electrode 322 and the voltage E of the core wire 11 are the unknown values. The first measurement capacitor C3, the voltage division capacitor C2, the second measurement capacitor C3', the voltage V1 and the voltage V2 are the known values or the measurable values.

<Fixing Part>

As illustrated in FIG. 7, the fixing part 310 is equipped with a plate-shaped lower-side fixing section 310a (a first plate-shaped member) which grips the electric wire 10 from the lower side, a plate-shaped upper-side fixing section 310b (a second please-shaped member) which grips the electric wire 10 from the upper side by being combined with the lower-side fixing section 310a, a shaft 311 which pivotally supports the lower-side fixing section 310a and the upper-side fixing section 310b at an end on the side which is opposite to the electric wire holding side and a spring 312 which actuates the lower-side fixing section 310a and the upper-side fixing section 310b in a direction that the electric wire 10 is held. The fixing part 310 is a clip which grips the electric wire 10 with the lower-side fixing section 310a and the upper-side fixing section 310b. The fixing part 310 holds the electric wire 10 by spreading the first electrode 321 side of the lower-side fixing section 310a and the second electrode 322 side of the upper-side fixing section 310b against the spring 312 and presses the electric wire 10 in a circumferential direction of the shaft 311. The fixing part 310 holds the electric wire 10 with the first electrode 321 and the second electrode 322 gripping it with the mutually equal pressing forces.

The fixing part 310 adopts a configuration that the first measurement capacitor C3, the voltage division capacitor C2 and/or the second measurement capacitor C3' are housed therein. Alternatively, the fixing part 310 is equipped with a terminal which is adapted to connect the first measurement capacitor C3, the voltage division capacitor C2 and/or the second measurement capacitor C3' to the first electrode 321 and the second electrode 322 which are provided on the fixing part 110 and to the terminals 331, 332. That is, the non-contact voltage measurement device 300 may have either a structure that each capacitor is housed in the fixing part 310 or a configuration that each capacitor is externally attached to the outside of the fixing part 310. The former configuration has such advantages that handling thereof is easy and it is higher in safety because the capacitors are not exposed to the outside. The latter configuration has such advantages that cost reduction can be promoted because the capacitors are not built in and selection of the capacitor is easy. In particular, in a case of the configuration that it is in the form of the readily attachable clip and it grips the electric wire 10 with actuating force of the spring 312 as in the present embodiment, it is expected to use it more handily. Accordingly, it is desirable that each capacitor be housed in the fixing part 310 and thereby usability can be more improved.

<First Electrode and Second Electrode>

As illustrated in FIG. 7, the first electrode 321 and the second electrode 322 are metal plates or metal foil which are formed on the holding side of the fixing part 310. The first electrode 321 and the second electrode 322 are electrically insulated from each other. When measuring the voltage E of the core wire 11, the first electrode 321 and the second electrode 322 hold the electric wire 10. The areas S of the first electrode 321 and the second electrode 322 are made equal to each other. In addition, the first electrode 321 and the second electrode 322 are pressed against the electric wire 10 with the same pressing forces by the fixing part 310.

As illustrated in FIG. 7, the first electrode 321 is connected to GND via the voltage division capacitor C2 and the first measurement capacitor C3 which are connected in series with each other. The connection point N1 between the voltage division capacitor C2 and the first measurement capacitor C3 is connected to the terminal 131 which is adapted to measure the voltage V1. In addition, the second electrode 322 is connected to GND via the second measurement capacitor C3'. The connection point N2 between the second electrode 322 and the second measurement capacitor C3' is connected to the terminal 132 which is adapted to measure the voltage V2.

In the following, a voltage measuring method of the non-contact voltage measurement deice 300 which is configured as mentioned above will be described. As illustrated in FIG. 7, the two first electrode 321 and second electrode 322 which are the same as each other in area S are installed on the electric wire holding side of the fixing part 310 of the non-contact voltage measurement device 300 so as to face each other and the two first electrode 321 and second electrode 322 are pressed against the electric wire 10 with the same pressing forces by the fixing part 310. The fixing part 310 is the clip which grips the electric wire 10 with the lower-side fixing section 310a and the upper-side fixing section 310b and therefore the first electrode 321 and the second electrode 322 are pressed against the electric wire 10 with the same pressing forces. The voltages V1, V2 which are divided between the capacitances (C1, C1') of the insulating coating of the electric wire 10 and between the capacitance (C2, C3) of the voltage division capacitor C2 and the first measurement capacitor C3 are measured at two places on the electric wire 10. In the present embodiment, the two first electrode 321 and second electrode 322 which are the same as each other in area S are formed on the fixing part 110 and the two first electrode 321 and second electrode 322 are pressed against the electric wire 10 with the same pressing forces. From this, the aforementioned formula (5) is established.

Here, even if the capacitances (C1, C1') of the insulating coating of the electric wire 10 change due to the moisture absorption and so forth, C1 and C1' will deteriorate in a similar way because the first electrode 321 and the second electrode 322 are formed at mutually facing positions. Therefore, the influence of voltage measurement in association with the environmental changes and the aging changes can be suppressed.

The non-contact voltage measurement device 300 of the present embodiment can be applied to the non-contact voltage division system 15 illustrated in FIG. 4 and the same effects can be obtained. Simple and easy installation and detachment of the non-contact voltage measurement device 300 become possible by configuring the non-contact voltage measurement device 300 of the present embodiment so as to grip the electric wire 10 with the lower-side fixing section 310a and the upper-side fixing section 310b with the aid of the spring 312. However, in a case of long-term installation, it is desirable to fix the fixing part 310 to the electric wire 10 so as not to move as in the first and second embodiments.

Fourth Embodiment

Figure 8A:
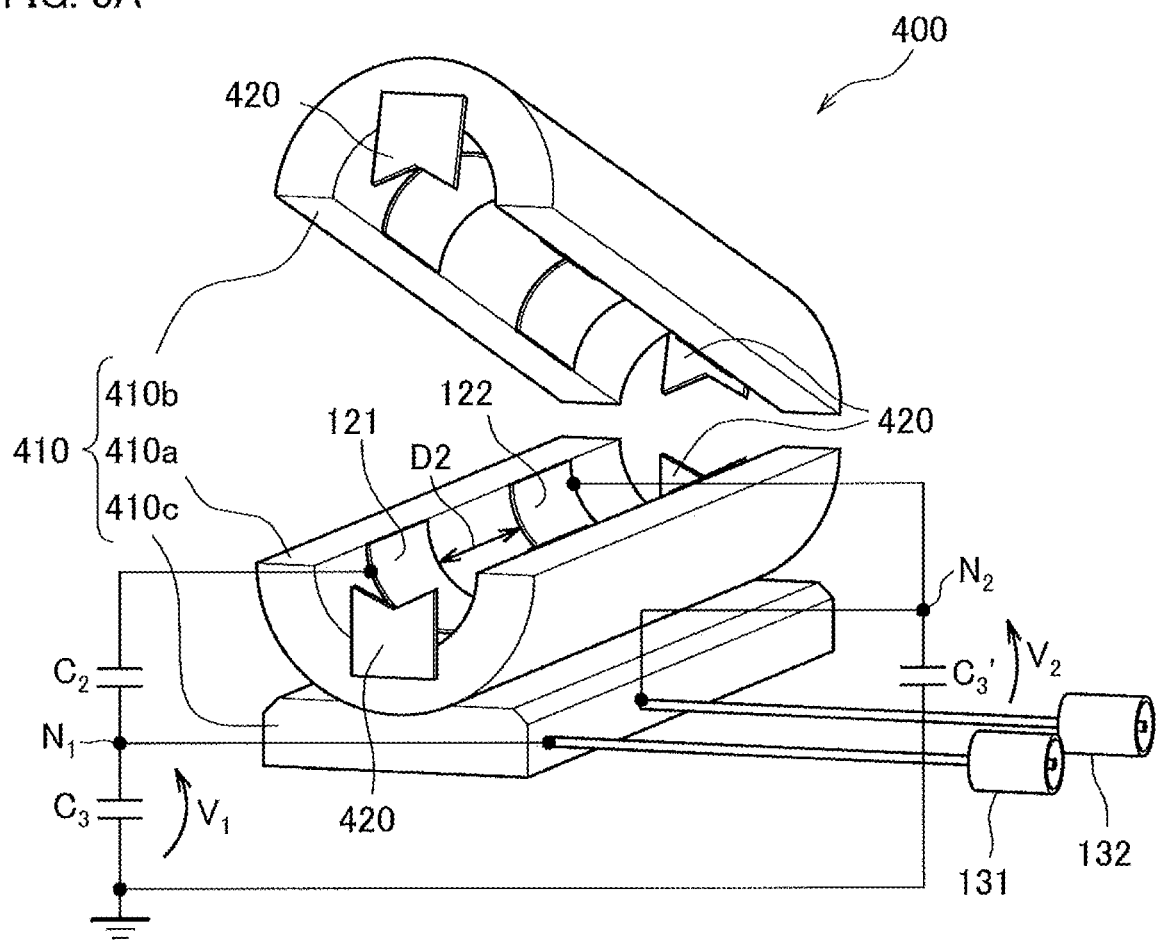
Figure 8B:
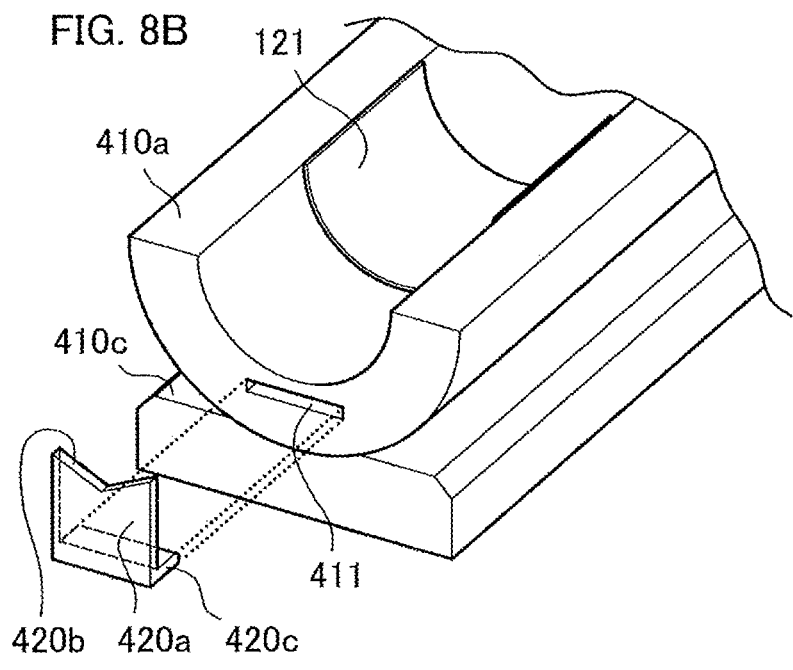

The configurations that the electrodes of the fixing part are brought into close contact with the electric wire were described in the first to third embodiments. In the present invention, close contact of the electrodes of the fixing part with the electric wire is not essential and they may be connected together via an air layer. FIG. 8 is diagrams illustrating a configuration of a non-contact voltage measurement device according to the fourth embodiment of the present invention, in which FIG. 8A is a perspective view illustrating the whole configuration thereof and FIG. 8B is a perspective view of essential parts thereof. The same numerals are assigned to the constitutional parts which are the same as those in FIG. 1 and description of duplicated parts is omitted. As illustrated in FIG. 8A, a non-contact voltage measurement device 400 is equipped with a cylindrical fixing part 410 which holds the electric wire 10 (see FIG. 3), grip and hold sections 420 which are attached to the both ends of the fixing part 410 and grip and hold the electric wire 10 in a space on the inner peripheral surface of the fixing part 410, the first electrode 121 and the second electrode 122 which are provided on an electric wire holding side inner peripheral surface of the fixing part 410 separately from each other by the distance D2, the first measurement capacitor C3 and the voltage division capacitor C2 which are connected to the first electrode 121, the second measurement capacitor C3' which is connected to the second electrode 122, the terminal 131 which is adapted to measure the voltage V1 which is applied to the first measurement capacitor C3 and the terminal 132 which is adapted to measure the voltage V2 which is applied to the second measurement capacitor C3'. As described above, the capacitance C1 of the insulating film between the core wire 11 of the electric wire 10 (see FIG. 3) and the first electrode 121, the capacitance C1' of the insulating film between the core wire 11 of the electric wire 10 and the second electrode 122 and the voltage E of the core wire 11 are the unknown values. The first measurement capacitor C3, the voltage division capacitor C2, the second measurement capacitor C3', the voltage V1 and the voltage V2 are the known values or the measurable values.

<Fixing Part and Grip and Hold Sections>

As illustrated in FIG. 8A, the fixing part 410 is equipped with a lower-side fixing section 410a which is semi-annular in the cross sectional view, an upper-side fixing section 410b which is combined with the lower-side fixing section 410a and is semi-annular in the cross sectional view and a pedestal 410c which fixes the bottom of the lower-side fixing section 410a and from which the terminals 131, 132 are drawn out. As illustrated in FIG. 8B, openings 411 into which attachment portions 420c of the grip and hold sections 420 are to be inserted are formed in the both ends of the lower-side fixing section 410a and the upper-side fixing section 410b. The grip and hold sections 420 are freely attached to and detached from the fixing part 410. In addition, although illustration is omitted, it is equipped with fixing means for fixing the lower-side fixing section 410a and the upper-side fixing section 410b by mutually superimposing them concentrically. This fixing means is, for example, hinge portions (illustration is omitted) which are provided on one ends of the lower-side fixing section 410a and the upper-side fixing section 410a and hook portions (illustration is omitted) which are provided on the other ends thereof. In addition, this fixing means is bolt/nut which fasten together flange portions of the lower-side fixing section 510a and the upper-side fixing section 510b which are illustrated in FIG. 10 which will be described later.

Figure 9A:
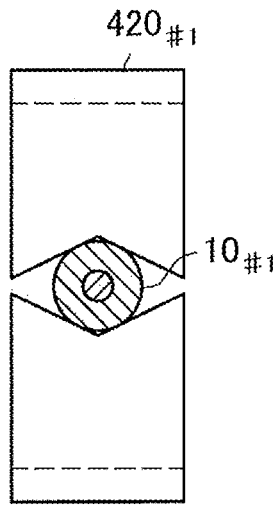
FIGS. 9A to 9C are diagrams illustrating types of a grip and hold section of a fixing part of the non-contact voltage measurement device according to the abovementioned fourth embodiment.
Figure 9B:
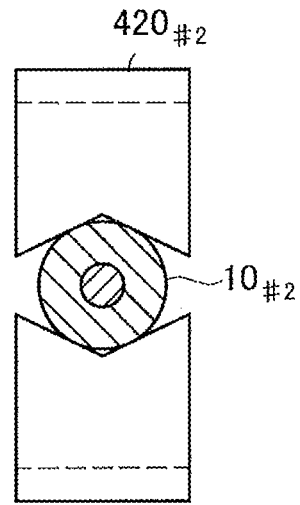
Figure 9C:
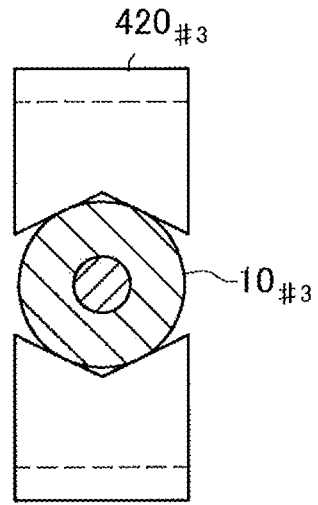

As illustrated in FIG. 8B, the grip and hold section 420 is configured by a body portion 420a which is a plate-shaped member, a V-groove 420b which is formed in an upper end of the body portion 420a and an attachment portion 420c which extends from a lower end of the body portion 420a in a direction which is orthogonal to the body portion 420a. The attachment portions 420c are fixed by being inserted into the openings 411 which are formed in the both ends of the lower-side fixing section 410a and the upper-side fixing section 410b (see FIG. 8A). Since the attachment portion 420c is fitted into the widened opening 411 with no gap, it does not rattle after attached. As illustrated in FIGS. 9A to 9C, a plurality of types (grip and hold sections $420_{\#1}$ to $420_{\#3}$) of the grip and hold sections 420, which are mutually different in length of the body portion 420a (see FIG. 8A), are prepared in conformity to thicknesses (radial widths) of the electric wire 10 (electric wires $10_{\#1}$ to $10_{\#3}$). Incidentally, also there may be an aspect that a plurality of types of the V-grooves 420b (see FIG. 8A), which are mutually different in inclination angle, are prepared in place of or in combination with classes of the length of the body portion 420a. The attachment portion 420c (see FIG. 8A) is communalized and therefore can be replaced in conformity to the thickness of the electric wire 10.

The fixing part 410 adopts a configuration that the first measurement capacitor C3, the voltage division capacitor C2 and/or the second measurement capacitor C3' are housed therein. Alternatively, the fixing part 410 is equipped with a terminal which is adapted to connect the first measurement capacitor C3, the voltage division capacitor C2 and/or the second measurement capacitor C3' to the first electrode 121 and the second electrode 122 which are provided in the fixing part 410 and to the terminals 131, 132. That is, the non-contact voltage measurement device 400 may have either a structure that each capacitor is housed in the fixing part 410 or a configuration that each capacitor is externally attached to the outside of the fixing part 410.

In the present embodiment, the effects which are the same as those of the first to third embodiments can be obtained. In particular, the non-contact voltage measurement device 400 of the present embodiment is equipped with the grip and hold member 420 as part of the fixing part 410. The voltage of the core wire 11 can be measured not depending on the thickness of the electric wire 10 by gripping and holding the electric wire 10 via the grip and hold member 420. Incidentally, in the present embodiment, since the electrodes are not in close contact with the electric wire as in the first to third embodiments and are connected thereto via the air layer, a measured signal level is slightly lowered.

Fifth Embodiment

FIG. 10 is a diagram illustrating a configuration of a non-contact voltage measurement device according to the fifth embodiment of the present invention. The same numerals are assigned to the constitutional parts which are the same as those in FIG. 1 and description of duplicated parts is omitted. As illustrated in FIG. 10, a non-contact voltage measurement device 500 is equipped with a cylindrical fixing part 510 which holds the electric wire 10 (see FIG. 3) by sandwiching it from the both sides, the first electrode 121 and the second electrode 122 which are provided on an electric wire holding side inner peripheral surface of the fixing part 510 separately from each other by the distance D2, the first measurement capacitor C3 and the voltage division capacitor C2 which are connected to the first electrode 121, the second measurement capacitor C3' which is connected to the second electrode 122, the terminal 131 (the voltage measurement means) which is adapted to measure the voltage V1 which is applied to the first measurement capacitor C3, and the terminal 132 (the voltage measurement means) which is adapted to measure the voltage V2 which is applied to the second measurement capacitor C3'.

<Fixing Part>

As illustrated in FIG. 10, the fixing part 510 is equipped with a lower-side fixing section 510a which supports the electric wire 10 from the lower side and is semi-annular in the cross sectional view, an upper-side fixing section 510b which presses the electric wire 10 from the upper side by being combined with the lower-side fixing section 510a and is semi-annular in the cross sectional view and a pedestal 510c which fixes the bottom of the lower-side fixing section 510a and from which the terminals 131, 132 are drawn out. The lower-side fixing section 510a has a flange portion 511a which extends in a radial direction and the upper-side fixing section 510b has a flange portion 511b which is formed to face the flange portion 511a of the lower-side fixing section 510a. Through-holes (illustration is omitted) through which bolts 512a to 512d (adjustment means) which fasten together the flange portions 511a, 511b pass are formed in both ends of the flange portion 511a and the flange portion 511b. The flange portion 511a and the flange portion 511b are fastened together with the bolts 512a to 512d and nuts 513a to 513d (adjustment means) and thereby the lower-side fixing section 510a and the upper-side fixing section 510b are mutually superimposed concentrically and fixed.

The pressing force that the fixing part 510 presses the first electrode 121 and the pressing force that the fixing part 510 presses the second electrode 122 can be changed by adjusting tightening degrees of the bolts 512a, 512b on one sides (the front sides in FIG. 10) and the bolts 512c, 512d on the other sides (the rear sides in FIG. 10) in the bolts 521a to 512d on the both ends of the flange portions 511a, 511b. The radial distance D1 up to the first electrode 121 or the second electrode 122 can be made different by changing the pressing force of pressing the first electrode 121 and the pressing force of pressing the second electrode 122. As a result, the capacitances (C1, C1') of the insulating coating of the electric wire 10 can be made different from each other at the time of calibration.

Example 1

Figure 11:
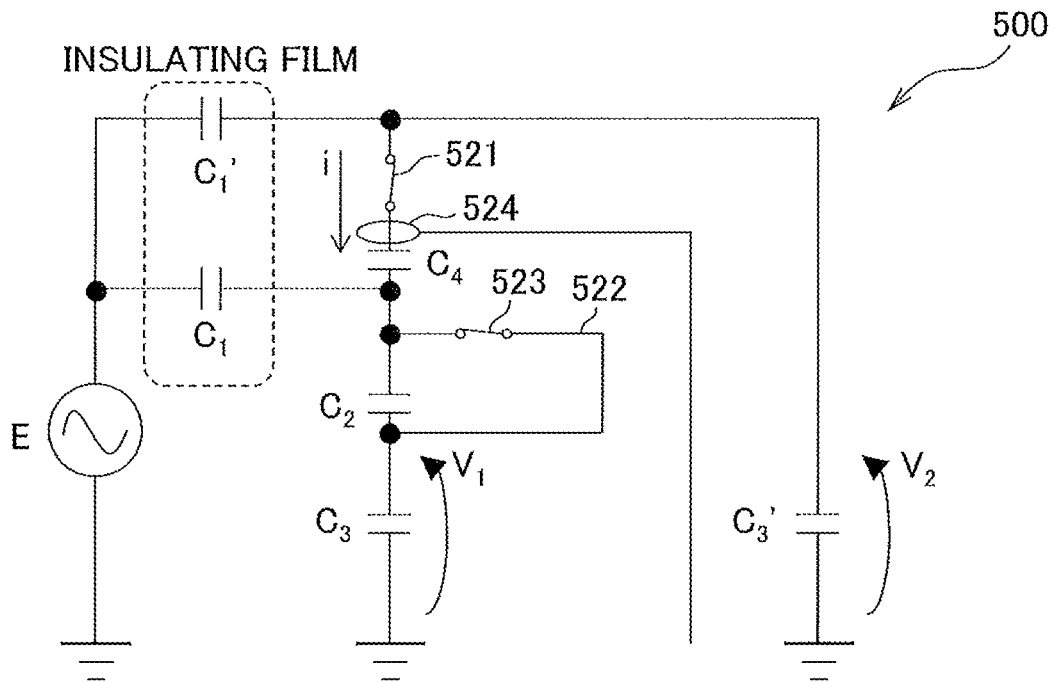
FIG. 11 is an equivalent circuit diagram at the time of calibration of the non-contact voltage measurement device according to the abovementioned fifth embodiment.

FIG. 11 is an equivalent circuit diagram at the time of calibration of the non-contact voltage measurement device 500 in FIG. 10. As illustrated in FIG. 11, the non-contact voltage measurement device 500 short-circuits the capacitances (C1, C1') of the insulating coating of the electric wire 10 via a capacitor C4 and a switch 521 at the time of calibration. In addition, it short-circuits the both ends of the voltage division capacitor C2 via a signal line 522 and a switch 523. Further, it measures a current i which flows from C1' to the capacitor C4 at the time of short-circuiting by a current sensor 524. In the above configuration, the non-contact voltage measurement device 500 short-circuits C1' and C1 via the capacitor C4 and the switch 521 and further short-circuits the both ends of the voltage division capacitor C2 via the switch at the time of calibration. It adjusts the pressing forces of the fixing part (see FIG. 10) in such a manner that C1'=C1, that is, the current i which flows to the capacitor C4 is reduced to zero. Specifically, when mutually superimposing the lower-side fixing section 510a and the upper-side fixing section 510b, it is performed while adjusting fastening forces (tightening forces) of the bolts 512a to 512d and the nuts 513a to 513d of the flange portions 511a and the flange portion 511b. The non-contact voltage measurement device 500 is able to realize voltage measurement in the equivalent circuit diagram illustrated in FIG. 2 after completion of calibration by adjusting the pressing forces of the fixing part 510 in such a manner that the current i which flows to the capacitor C4 is reduced to zero and thereby highly accurate non-contact voltage measurement becomes possible. Here, although the switches 521, 523 are used in the present embodiment, the switches 521 and 523 may be used only at the time of installation or at the time of calibration of the non-contact voltage measurement device 500 and the switches 521, 523 may be brought into open states or the capacitor C4 and a circuit used for short-circuit may be detached in other cases.

In the non-contact voltage measurement device 500, the two first electrode 121 and second electrode 122 which are the same as each other in area S are formed in the fixing part 510 and the two first electrode 121 and second electrode 122 are pressed against the electric wire 10 with almost the same pressing forces. From this, a relation of C1≈C1' is established between the capacitances (C1, C1') of the insulating coating of the electric wire 10. When approximating (see a part which is surrounded by a broken line in FIG. 11) it as C1=C1' by ignoring the difference between the capacitances, the following relational Formulas (6) to (8) are established.

$$E = V_2 C_3' \left( \frac{1}{C_1} + \frac{1}{C_4} + \frac{1}{C_3'} \right) \quad (6)$$

$$E = V_1 C_3 \left( \frac{1}{C_1} + \frac{1}{C_2} + \frac{1}{C_3} \right) \quad (7)$$

$$C_1' = C_1 \quad (8)$$

The voltage E of the core wire 11 is expressed by Formula (9) from the abovementioned relational Formulas (6) to (8).

$$E = \frac{-\frac{1}{C_2} - \frac{1}{C_3} + \frac{1}{C_4} + \frac{1}{C_3'}}{\frac{1}{V_2 C_3'} - \frac{1}{V_1 C_3}} \quad (9)$$

In addition, if the voltage E of the core wire 11 is already known, the difference between C1 and C1' may be corrected by using the known voltage E as the voltage for correction. In this case, the method of putting the capacitance of C1−C1' into the voltage division capacitor C2 is conceivable. That is, if the voltage E in the aforementioned expressions (2), (3) is already known, C1'=C1 in the aforementioned expression (4) can be verified by using the aforementioned expression (5). In addition, as a specific method of correcting the difference between C1 and C1', the fastening forces of the bolts 512a, 512b and the fastening forces of the bolts 512c, 512d of the flange portions 511a, 511b of the lower-side fixing section 510a and the upper-side fixing section 510b of the non-contact voltage measurement device 500 illustrated in FIG. 10 are changed. For example, in a case where C1'>C1 is decided by calibration, a connection is made in such a manner that the capacitance (C1) of the insulating coating on the first electrode 121 side is made relatively larger than the capacitance (C1') of the insulating coating on the second electrode 122 side. Specifically, there is a method of making the fastening forces of the bolts 512a, 512b of the fixing part 510 (see FIG. 10) larger than the fastening forces of the bolts 512c, 512d or loosening the bolts 512c, 512d.

Example 2

Figure 12:
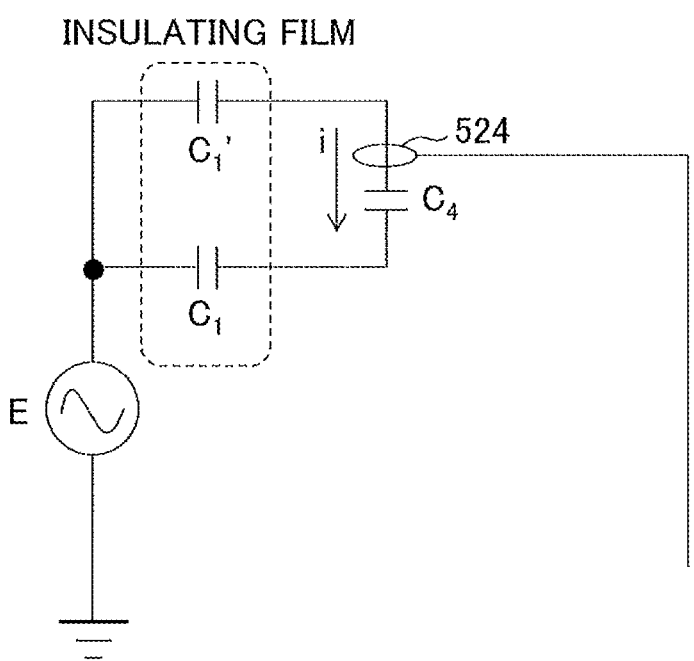
FIG. 12 is an equivalent circuit diagram at the time of calibration of the non-contact voltage measurement device according to the abovementioned fifth embodiment.

FIG. 12 is an equivalent circuit diagram at the time of calibration of the non-contact voltage measurement device 500 in FIG. 10. As illustrated in FIG. 12, the non-contact voltage measurement device 500 short-circuits the capacitances (C1, C1') of the insulating coating of the electric wire 10 via the capacitor C4 at the time of calibration. The difference from the calibration example 1 (see FIG. 11) lies in the point that the voltage division capacitor C2, the first measurement capacitor C3 and the second measurement capacitor C3' are not connected. The current i which flows from C1' to the capacitor C4 at the time of short circuit is measured by the current sensor 524. In the above configuration, the non-contact voltage measurement device 500 short-circuits C1' and C1 via the capacitor C4 at the time of calibration. It adjusts the pressing forces of the fixing part 510 (see FIG. 10) in such a manner that C1'=C1 is established, that is, the current i which flows to the capacitor C4 is reduced to zero. Highly accurate non-contact voltage measurement becomes possible by adjusting the pressing forces of the fixing part 510 in such a manner that the current i which flows to the capacitor C4 is reduced to zero. After completion of adjustment of the pressing forces of the fixing part 510, the voltage of the core wire can be accurately measured by replacing it with the equivalent circuit illustrated in FIG. 2. In addition, if the voltage E of the core wire 11 is already known, the difference between C1 and C1' may be corrected by using the known voltage E as the voltage for correction. In this case, the method of putting the capacitance of C1–C1' into the voltage division capacitor C2 is conceivable.

Sixth Embodiment

Figure 13:
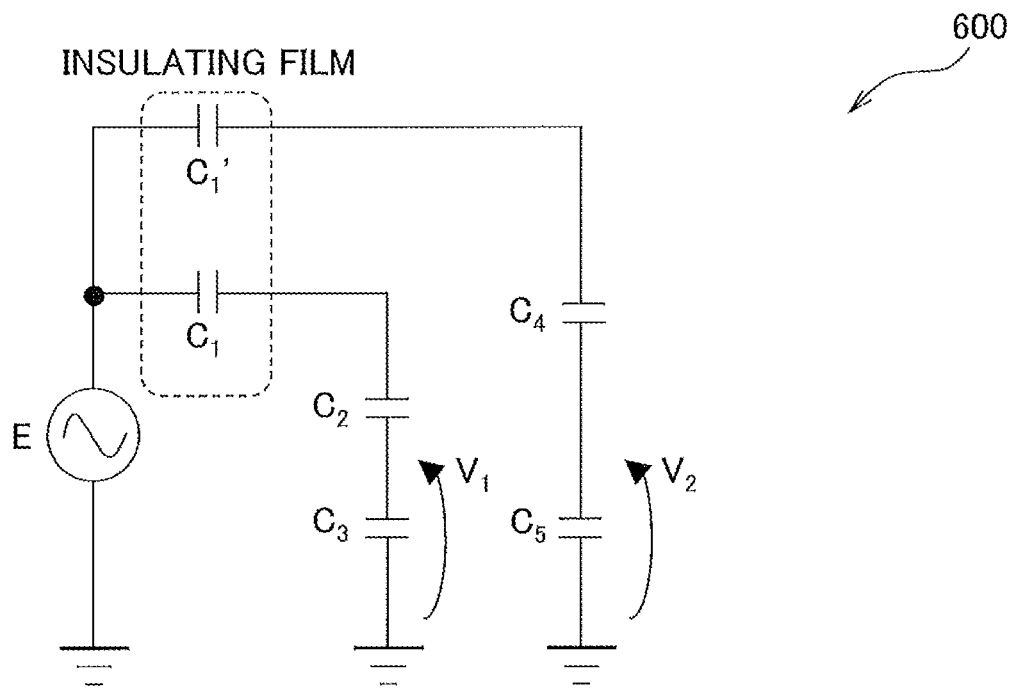
FIG. 13 is an equivalent diagram at the time of calibration of a non-contact voltage measurement device according to a sixth embodiment of the present invention.

FIG. 13 is an equivalent circuit diagram at the time of calibration of a non-contact voltage measurement device according to the sixth embodiment of the present invention. As illustrated in FIG. 13, a non-contact voltage measurement device 600 is equipped with the first measurement capacitor C3 and the voltage division capacitor C2 which are connected to the first electrode 121 (see FIG. 1), and a second measurement capacitor C5 and the voltage division capacitor C4 (a second voltage division capacitor) which are connected to the second electrode 122 (see FIG. 1). That is, the non-contact voltage measurement device 600 is an example of a case where the voltage division capacitor C4 is further added to the C1' side of the non-contact voltage measurement device 100 in FIG. 2. As in a case of dividing the voltage between the capacitances (C2, C3) of the voltage division capacitor C2 and the first measurement capacitor C3 on the C1 side, the non-contact voltage measurement device 600 divides the voltage between the capacitances (C4, C5) of the voltage division capacitor C4 and the second measurement capacitor C5 also on the C1' side. The voltages V1, V2 which were divided on that occasion are measured at two places on the electric wire 10. A way of thinking is the same as that in the first embodiment and the following relational Formulas (10) to (12) are established.

$$E = V_2 C_5 \left( \frac{1}{C_1'} + \frac{1}{C_4} + \frac{1}{C_5} \right) \quad (10)$$

$$E = V_1 C_3 \left( \frac{1}{C_1} + \frac{1}{C_2} + \frac{1}{C_3} \right) \quad (11)$$

$$C_1' = C_1 \quad (12)$$

The voltage E of the core wire 11 is expressed by a formula (13) from the abovementioned relational Formulas (10) to (12).

$$E = \frac{-\frac{1}{C_2} - \frac{1}{C_3} + \frac{1}{C_4} + \frac{1}{C_5}}{\frac{1}{V_2 C_5} - \frac{1}{V_1 C_3}} \quad (13)$$

Seventh Embodiment

Figure 14:
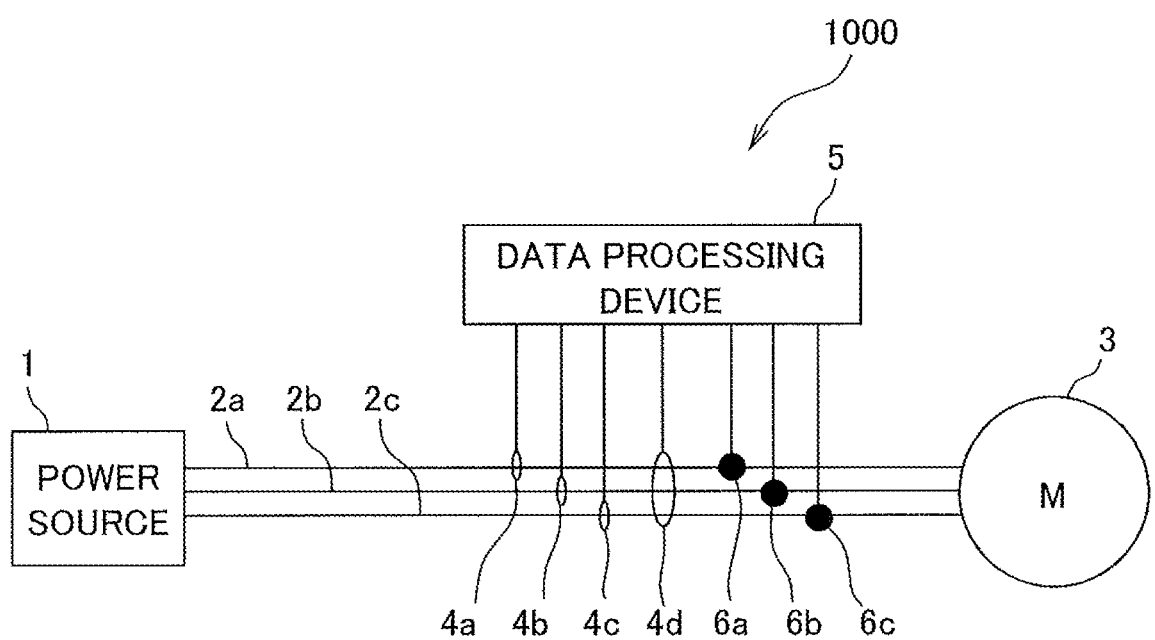
FIG. 14 is a configuration diagram of a motor diagnosis apparatus according to a seventh embodiment of the present invention in which the non-contact voltage measurement devices are used.

FIG. 14 is a configuration diagram of a motor diagnosis apparatus according to the seventh embodiment of the present invention in which the non-contact voltage measurement devices are used. As illustrated in FIG. 14, electric power is supplied from a power source 1 to a motor 3 (a rotating machine) via power supply wires 2a, 2b, 2c. Although a case of a three-phase motor which utilizes three power supply wires is illustrated here, there may be the different number of phases. Current sensors 4a, 4b, 4c are installed to surround the power supply wires 2a, 2b, 2c respectively and measure phase currents. A current sensor 4d is installed to surround the power supply wires 2a, 2b, 2c and measures a zero-phase current. There is no limitation to the kinds of the current sensors 4a, 4b, 4c, 4d. For example, penetration type current sensors, clamp-type current sensors, slit-type current sensors, optical fiber sensors using the magneto-optical effect and so forth can be used as the current sensors 4a, 4b, 4c, 4d. In addition, non-contact voltage sensors 6a, 6b, 6c are connected to the power supply wires 2a, 2b, 2c. The non-contact voltage sensors 6a, 6b, 6c are equipped with the non-contact voltage measurement devices 100 to 600 in the abovementioned respective embodiments. The non-contact voltage sensors 6a, 6b, 6c detect the voltages (potentials) E of the respective power supply wires 2a, 2b, 2c of three phases out of contact therewith, convert them into low-voltage signals and transmit them to a data processing device 5. The data processing device 5 detects phase voltages of the power supply wires 2a, 2b, 2c of three phases on the basis of the signals from the non-contact voltage sensors 6a, 6b, 6c. Although an example in which the current and non-contact voltage sensors are connected to all the three phases is illustrated here, the number of sensors may be limited only to that of target phases. In addition, the zero-phase current sensor 2d either may be installed or may not be installed. However, in order to obtain a sign of deterioration which is particularly caused by insulation, it is desirable to install it. The abovementioned current sensors 4a, 4b, 4c, non-contact voltage sensors 6a, 6b, 6c and data processing device 5 configure a motor diagnosis apparatus 1000 in a case of supplying the electric power from the power source 1 to the motor 3 via the power supply wires 2a, 2b, 2c.

Figure 15:
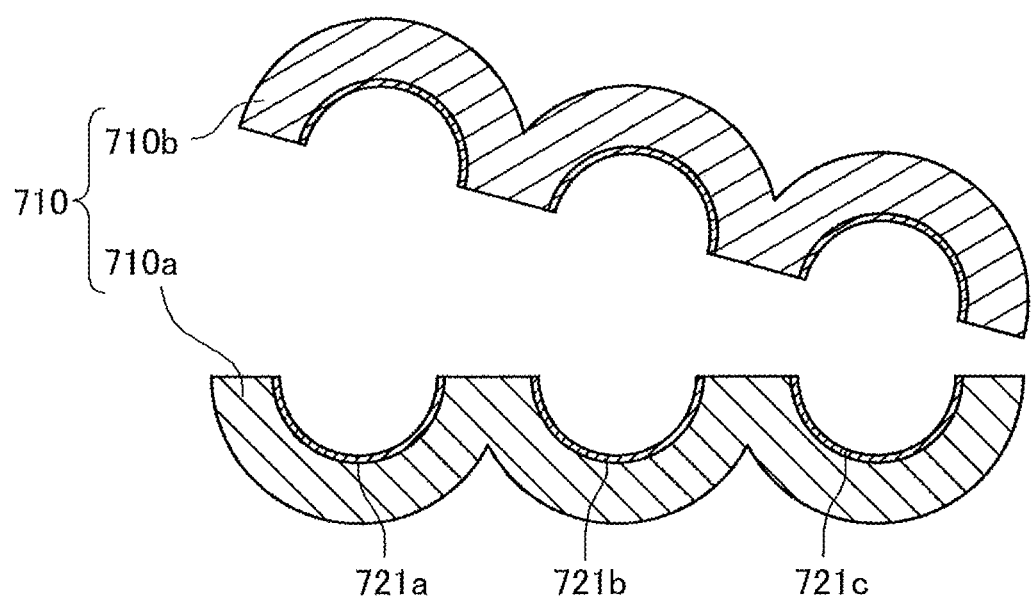
FIG. 15 is a sectional diagram of a fixing part which holds electric wires of three phases of the non-contact voltage measurement device according to the abovementioned each embodiment.

FIG. 15 is a sectional diagram of a fixing part which holds the electric wires of three phases of the non-contact voltage measurement device. As illustrated in FIG. 15, a fixing part 710 is equipped with a lower-side fixing section 710a which supports the electric wires of three phases (the power supply wires 2a, 2b, 2) from the lower side and that three semi-circles range in the cross sectional view and an upper-side fixing section 710b which presses the electric wires of three phases from the upper side by being combined with the lower-side fixing section 710a and that three semi-circles range in the cross sectional view. In addition, first electrodes 721a, 721b, 721c for the three phases and a second electrode (illustration is omitted) are provided on an inner peripheral surface of the fixing part 710. In a case of installation for all the three phases, it is possible to make one fixing part 710 cope with the first electrodes 721a, 721b, 721c for the three phases and the second electrode (illustration is omitted) as illustrated in FIG. 15. As a position where the fixing part 710 is to be installed, it is desirable to install it at a position where it does not move with the vibration of the motor and so forth. Thereby, installation easiness in installation for all the three phases is improved.

<Diagnostic Method>

There is no particular limitation to the diagnostic method. For example, a diagnosis which is based on threshold values of currents and information on voltages which are measured by the non-contact voltage sensors 6a, 6b, 6c is conceivable. Specifically, in a case where the phase currents and a leak current flow exceeding the threshold values in advance, presence/absence of a change in applied voltage is examined, in a case where the applied voltage is not changed, it is decided as abnormality and information thereon is transmitted to a user. In addition, presence/absence of the abnormality can also be examined by setting a threshold value for a value obtained by dividing a current value by a voltage value. Application of machine learning is also possible in order to sense a weaker signal. For example, the currents and the output voltages from the non-contact voltage measurement devices 100 to 600 are set on axes and a normal state cluster is formed from amplitudes thereof. A degree of abnormality can be calculated from a multidimensional special distance from the normal state cluster to measurement data. Although in the abovementioned one, the amplitudes of signals are used in the diagnosis, the abnormality degree may be calculated by, for example, plotting a value obtained by performing signal processing on a signal on an axis. As the signal processing, for example, Fourier transform, wavelet transform, Laplace transform, smoothing processing, noise removal processing, data thinning, frequency filtering, effective value conversion and so forth are given and also processing that those are optionally combined with one another may be performed. In a case where the Fourier transform, the wavelet transform and the Laplace transform are executed, the abnormality degree may be calculated by plotting a value of each frequency component on the axis. In addition, as an index for calculation of the abnormality degree, a value obtained by dividing the multidimensional special distance from the normal state cluster to the measurement data by variance of the normal state cluster. An axis to be set can be freely set on the basis of domain knowledge.

Figure 16:
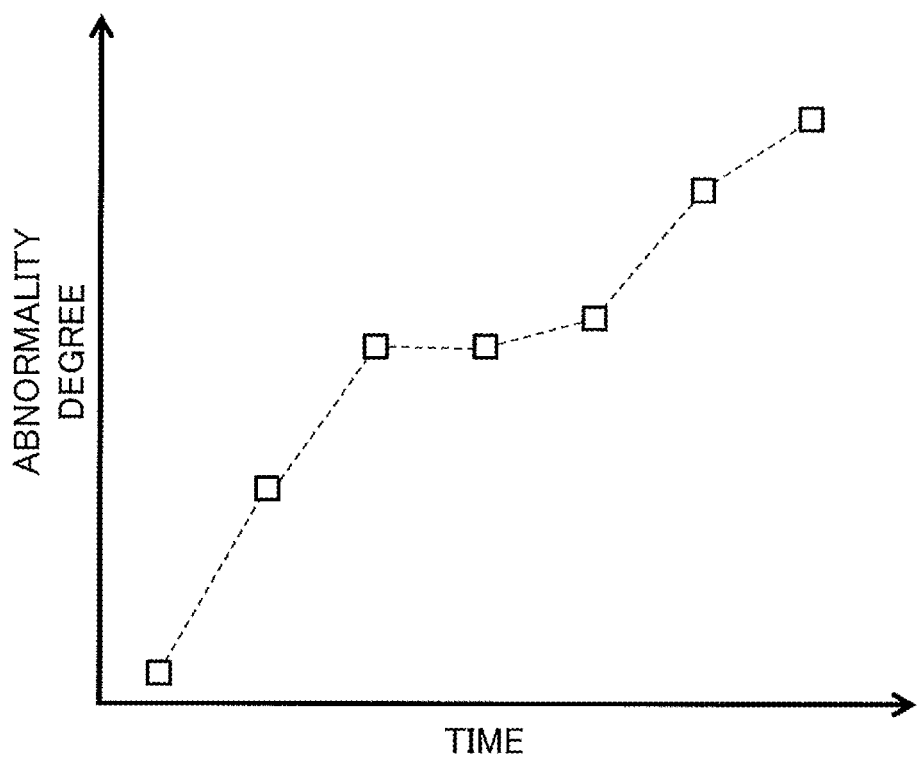
FIG. 16 a diagram illustrating a calculation result that a current and the output voltage from the non-contact voltage measurement device are set on axes and an abnormality degree is calculated from a multidimensional special distance from a normal state cluster to measurement data.

FIG. 16 is a diagram illustrating a result of calculation that the current and the output voltage from the non-contact voltage measurement device are set on the axes and the abnormality degree is calculated from the multidimensional special distance from the normal state cluster to the measurement data. As illustrated in FIG. 16, a change in abnormality degree in association with progress of deterioration could be sensed. Incidentally, it may be applied to any diagnosis device on condition that it is the one which uses the voltages E calculated by the non-contact voltage measurement devices 100 to 600 in the abovementioned respective embodiments. In addition, a generator such as a wind power generator and so forth is included in the rotating machine in addition to the motor (the electric motor). In addition, it would be applicable to the diagnosis device of any equipment on condition that it is the equipment which supplies the voltage from the power source via the electric wire (the cable), not limited to the rotating machine. For example, as examples of applicable devices, industrial equipment such as high-voltage motors/generators, medium to constant voltage motors/generators, inverters, transformers and so forth, electrical equipment in general are given.

The present invention is not limited to the aforementioned embodiments and includes other modified examples and application example within the range not deviating from the gist of the present invention described in the claims. For example, it is possible to replace part of a configuration of one embodiment with a configuration of another embodiment and it is also possible to add a configuration of another embodiment to a configuration of one embodiment. In addition, it is also possible to add, delete and replace another configuration to, from and with part of a configuration of each embodiment.

In addition, only control lines and communication lines which are thought to be necessary in description are illustrated and all control lines and communication lines in a product are not necessarily illustrated. Practically, it may be thought that almost all configurations are mutually connected.

The invention claimed is:

1. A non-contact voltage measurement device used for measuring a voltage applied to a core wire of an electric wire which is coated with an insulator, without contacting the core wire, the device comprising:
a fixing part arranged to hold the electric wire;
a first electrode and a second electrode that are provided in the fixing part separately from each other;
a first measurement capacitor and a first voltage division capacitor that are connected to the first electrode;
a second measurement capacitor that is connected to the second electrode; and
a voltage measurement detector configured to measure a voltage applied to the first measurement capacitor and a voltage applied to the second measurement capacitor,
wherein the fixing part holds the electric wire in such a manner that a force of pressing the first electrode against the electric wire and a force of pressing the second electrode against the electric wire are equal to each other,
wherein an area over which the first electrode is in contact with the electric wire and an area over which the second electrode is in contact with the electric wire are made equal to each other, and
wherein the fixing part is cylindrical and holds the electric wire with an inner peripheral surface, the first and second electrodes axially separated from each other along the cylinder.

2. A non-contact voltage measurement device used for measuring a voltage applied to a core wire of an electric wire which is coated with an insulator, without contacting the core wire, the device comprising:
a fixing part arranged to hold the electric wire;
a first electrode and a second electrode that are provided in the fixing part separately from each other;
a first measurement capacitor and a first voltage division capacitor that are connected to the first electrode;
a second measurement capacitor and a second voltage division capacitor that are connected to the second electrode; and
a voltage measurement detector configured to measure a voltage applied to the first measurement capacitor and a voltage applied to the second measurement capacitor,
wherein the fixing part holds the electric wire in such a manner that a force of pressing the first electrode against the electric wire and a force of pressing the second electrode against the electric wire are equal to each other,
wherein an area over which the first electrode is in contact with the electric wire and an area over which the second electrode is in contact with the electric wire are made equal to each other, and wherein the fixing part is cylindrical and holds the electric wire with an inner peripheral surface, the first and second electrodes axially separated from each other along the cylinder.

3. The non-contact voltage measurement device according to claim 1, further comprising:

a circuit configured to arithmetically operate a voltage applied to the core wire of the electric wire, on the basis of a capacitance of the first measurement capacitor and a capacitance of the first voltage division capacitor, and the measured voltages.

4. The non-contact voltage measurement device according to claim 3, wherein the circuit is configured to arithmetically operate a voltage applied to the core wire of the electric wire in accordance with the following formula:

Voltage=(first measurement capacitor/first voltage division capacitor)*(voltage 1*voltage 2)/(voltage 1−voltage 2), where the first measurement capacitor is a capacitance of the first measurement capacitor, first voltage division capacitor is a capacitance of the first voltage division capacitor, voltage 1 is the voltage applied to the first measurement capacitor, and voltage 2 is the voltage applied to the second measurement capacitor.

5. The non-contact voltage measurement device according to claim 2, further comprising:

a circuit configured to arithmetically operate a voltage E applied to the core wire of the electric wire, on the basis of a capacitance of the first measurement capacitor, a capacitance of the first voltage division capacitor, the second measurement capacitor, the second voltage division capacitor, and the measured voltages.

6. The non-contact measurement device according to claim 1, wherein a separation distance between the first electrode and the second electrode is larger than a radial distance from an outer peripheral portion of the core wire of the electric wire to the first electrode or the second electrode.

7. The non-contact voltage measurement device according to claim 1, wherein the first electrode is provided on an inner peripheral surface of one cylindrical end of the fixing part and the second electrode is provided on an inner peripheral surface of the other cylindrical end of the fixing part.

8. The non-contact voltage measurement device according to claim 1, wherein the fixing part is provided with a grip and hold section which grips and holds the electric wire.

9. The non-contact voltage measurement device according to claim 1, wherein the fixing part is provided with an adjuster configured to adjust a force of pressing the first electrode against the electric wire and a force of pressing the second electrode against the electric wire.

10. A diagnosis system used for diagnosing a state of equipment including a rotating machine by using a voltage which is measured by the non-contact voltage measurement device according to claim 1.

11. The non-contact measurement device according to claim 2, wherein a separation distance between the first electrode and the second electrode is larger than a radial distance from an outer peripheral portion of the core wire of the electric wire to the first electrode or the second electrode.

12. The non-contact voltage measurement device according to claim 2, wherein the fixing part is provided with a grip and hold section which grips and holds the electric wire.

13. The non-contact voltage measurement device according to claim 2, wherein the fixing part is provided with an adjuster configured to adjust a force of pressing the first electrode against the electric wire and a force of pressing the second electrode against the electric wire.

14. A diagnosis system used for diagnosing a state of equipment including a rotating machine by using a voltage which is measured by the non-contact voltage measurement device according to claim 2.

* * * * *